United States Patent
Shigemori et al.

(12) 
(10) Patent No.: US 6,558,053 B2
(45) Date of Patent: May 6, 2003

(54) SUBSTRATE PROCESSING APPARATUS

(75) Inventors: Kazuhito Shigemori, Kyoto (JP); Masakazu Sanada, Kyoto (JP); Minobu Matsunaga, Kyoto (JP); Katsushi Yoshioka, Kyoto (JP); Kenji Sugimoto, Kyoto (JP); Kaoru Aoki, Kyoto (JP); Moritaka Yano, Kyoto (JP); Satoshi Yamamoto, Kyoto (JP); Tsuyoshi Mitsuhashi, Kyoto (JP); Takashi Nagao, Kyoto (JP); Mitsumasa Kodama, Kyoto (JP); Yukihiko Inagaki, Kyoto (JP); Yoshihisa Yamada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/125,229

(22) Filed: Apr. 18, 2002

(65) Prior Publication Data

US 2002/0152958 A1 Oct. 24, 2002

(30) Foreign Application Priority Data

| | | |
|---|---|---|
| Apr. 19, 2001 | (JP) | 2001-121228 |
| Feb. 4, 2002 | (JP) | 2002-026338 |
| Feb. 4, 2002 | (JP) | 2002-026852 |
| Feb. 22, 2002 | (JP) | 2002-046587 |

(51) Int. Cl.[7] .................... G03D 5/00; B05C 11/02
(52) U.S. Cl. .................... 396/611; 118/52; 118/58; 118/300
(58) Field of Search .................... 396/611, 627; 355/27; 118/52, 58, 300; 414/935

(56) References Cited

U.S. PATENT DOCUMENTS

| | | | | |
|---|---|---|---|---|
| 6,099,598 A | * | 8/2000 | Yokoyama et al. | 414/935 |
| 6,126,338 A | * | 10/2000 | Akimoto | 396/611 |
| 6,215,545 B1 | * | 4/2001 | Matsuyama | 355/30 |
| 6,341,903 B1 | * | 1/2002 | Ueda | 396/611 |
| 6,371,667 B1 | * | 4/2002 | Kitano et al. | 396/611 |
| 6,466,300 B1 | * | 10/2002 | Deguchi | 355/27 |
| 2001/0016225 A1 | * | 8/2001 | Ogata et al. | 427/10 |

FOREIGN PATENT DOCUMENTS

| | | |
|---|---|---|
| JP | 3164739 | 3/2001 |

* cited by examiner

*Primary Examiner*—Alan A. Mathews
(74) *Attorney, Agent, or Firm*—Ostrolenk, Faber, Gerb & Soffen, LLP

(57) ABSTRACT

A substrate processing apparatus includes a coating section, a developing section, a heat-treating section and a transport mechanism. The coating section has first processing units each for performing a coverage process to supply a photoresist solution to a substrate and cover a surface of the substrate with the photoresist solution, a second processing unit for spinning the substrate, after the coverage process, at high speed to make the photoresist solution into a film, dry the photoresist film, and clean the substrate. All substrates are processed with the same coating conditions to suppress differences in quality among the substrates. The first and second processing units perform the respective processes concurrently to improve the throughput of substrate processing.

39 Claims, 18 Drawing Sheets

SUBSTRATE PROCESSING APPARATUS

BACKGROUND OF THE INVENTION (1) Field of the Invention

The present invention relates to substrate processing apparatus for processing substrates such as semiconductor wafers and glass substrates for liquid crystal displays. More particularly, the invention relates to a coating technique for supplying a coating solution such as a photoresist solution to form a film of coating solution on substrates.

(2) Description of the Related Art
Drawbacks of the Prior Art:

(I) A series of coating processes for forming a film of photoresist, for example, on a substrate may broadly be divided into the following processes. A first process is a "coverage process" for supplying a photoresist solution to the substrate to cover the entire surface of the substrate with the photoresist solution. A second process is a "leveling process" for making the photoresist solution on the substrate into a film. A third process is a "drying process" for drying the film of photoresist solution formed on the substrate. A fourth process, carried out as necessary, is a "removing process" for removing unwanted parts of the photoresist adhering to edges on the upper or front surface of the substrate having the film of photoresist formed thereon, and the photoresist adhering to the back surface of the substrate.

A conventional substrate processing apparatus having a coating unit carries out the above first to third processes or first to fourth processes consecutively with the single coating unit. Where, for example, a substrate processing apparatus has a spin coating unit for coating a substrate in a spin, the coating unit includes a spin chuck rotatable about a vertical axis while holding the substrate in horizontal posture, a coating solution supply nozzle for supplying a photoresist solution to the substrate held by the spin chuck, and a solvent supply nozzle for supplying a solvent to the back surface and edges of the substrate. The substrate processing apparatus having such a single coating unit consumes approximately 60 seconds in processing one substrate.

Incidentally, photoresists of the chemical amplification type that are becoming the mainline solution today are susceptible to the influence of a chemical contamination caused by atmospheric ammonia and the like. To minimize the time in which a substrate is exposed to atmosphere, the above substrate processing apparatus having the coating unit is connected with an exposing apparatus (i.e. stepper) that prints patterns on the substrate with a photoresist film formed thereon, to constitute an "in-line system" widely employed for consecutively performing a series of operations from a coating process to an exposing process.

The exposing apparatus connected to the substrate processing apparatus consumes approximately 30 seconds in processing one substrate. To secure a throughput equal to that of the exposing apparatus, the conventional substrate processing apparatus is provided with a plurality of (e.g. two) coating units for carrying out the first to third processes (or first to fourth processes) concurrently.

The coating units of the conventional substrate processing apparatus must form photoresist films on substrates with an average film thickness and a thickness distribution within specified ranges. For this purpose, coating conditions such as resist discharge, resist temperature, and temperature and humidity within the coating unit are adjusted for each coating unit.

However, circuit patterns printed and developed on the substrates with the photoresist films formed thereon by the respective coating units show that serious variations in quality such as precision of the developed patterns occur among the substrates.

(II) Conventional substrate processing apparatus may have various coating units for performing a coating process by supplying a coating solution such as a photoresist solution to substrates. One such example is a thermal transfer type coating unit that first supplies a coating solution to an applicator sheet, applies the sheet to a substrate to supply the coating solution to the substrate, and separates the sheet from the substrate after heat treatment, thereby transferring a coating film from the sheet to the substrate. Another example is a scan type coating unit having a slit nozzle that discharges a coating solution while scanning or sweeping over a substrate maintained still, to supply the coating solution to the substrate. A third type of coating unit is what is known as a spin coater that supplies a coating solution adjacent the center of a substrate spinning at high speed, spreading the coating solution from the center of the substrate by the centrifugal force of the substrate to form a film of coating solution over the entire surface of the substrate.

A photolithographic procedure where the coating solution is a photoresist solution, for example, includes a series of processes such as (1) supplying the photoresist solution to the substrate to form a photoresist film on the substrate (coating process), (2) an exposing process for exposing the substrate coated with the photoresist film, and (3) developing the exposed substrate (developing process).

Usually, the coating process (1) and developing process (3) are carried out in the same substrate processing apparatus using a coating unit, while the exposing process (2) is carried out by an exposing apparatus which is an external processing apparatus associated with the substrate processing apparatus. Substrates are transferred between the substrate processing apparatus and exposing apparatus through an interface forming a part of the substrate processing apparatus.

However, such a conventional construction has the following drawbacks.

The substrate having undergone the coating process (1) could be exposed in a defective manner (i.e. defocused) in the exposing apparatus.

That is, where different positions on the surface of the substrate are at different heights from the lens of the exposing apparatus, the variations in the height could exceed the depth of focus of the lens, thereby causing a blur. This results in a defective exposure to affect the uniformity in line width of patterns obtained from the exposing process. Conventionally, such a defective exposure is considered due to particles adhering to the surface of the substrate, or ununiformity of the photoresist film formed on the substrate. To avoid the defective exposure, it is conventional practice to clean the surface of the substrate before the coating process or, in the case of a spin coater, adjust the spinning speed of the substrate to uniform the photoresist film. However, such surface cleaning alone has proved no ultimate solution to the defective exposure.

(III) Improved throughput in particular among the processing capabilities of the substrate processing apparatus is desired nowadays. For this purpose, measures have been taken not only to improve transport capability but to increase the number of processing units for performing the same series of processes in parallel.

FIG. 1 is a conceptual diagram of a parallel processing in which step A is carried out concurrently by using two processing units. Step A has a processing time of 60 seconds, for example. This apparatus has an improved throughput of 30 seconds owing to the parallel processing. However, such a technique of parallel processing relying on an increased number of processing units entails disadvantages of increased cost and enlargement of the apparatus.

A technique for overcoming such disadvantages has been proposed in Japanese Patent No. 3164739, for example. In the technique proposed in this patent, a process is divided to reduce the processing time consumed by each step, thereby to reduce the number of parallel processing units. Thus, throughput may be maintained while achieving a cost reduction and compactness of the apparatus. FIG. 2 is a conceptual diagram of an apparatus using such a technique. In this apparatus, step A is divided into step B (with a processing time of 30 seconds) and step C (with a processing time of 30 seconds) to be carried out in series by dedicated processing units, respectively. Thus, the process shown in FIG. 2 also has a throughput of 30 seconds as in the case shown in FIG. 1.

Each of the dedicated processing units used in such an apparatus may have a construction specialized for the intended process. Thus, while maintaining the same throughput, the apparatus construction may be simplified and reduced in size to achieve a cost reduction and the like. Since all substrates are processed by the same processing unit, less individual differences occur with final products.

However, the technique described in the above patent does not allow an equal processing time for the divided steps in an actual processing situation. The step consuming the longer time limits the throughput, resulting in a throughput reduction.

SUMMARY OF THE INVENTION

The present invention has been made having regard to the state of the art noted above, and its object is to provide a substrate processing apparatus for improving the throughput of substrate processing and checking quality variations among substrates, or for coating substrates with high precision and efficiently processing the substrates in combination with an external processing apparatus, or for avoiding a reduction in throughput even when part of processing consumes an extended time.

To overcome the disadvantage noted in section (I) above, Inventors have made intensive research and attained the following finding.

When exposing and developing conditions are set according to substrates processed by one coating unit, these substrates will be satisfactory in quality, but substrates processed by the other coating unit are found inferior in quality to the first-mentioned substrates. That is, the respective coating units must be in agreement as to various coating conditions in order to suppress quality variations among the substrates. In practice, however, the coating units have components with varied characteristics, which makes it difficult to bring the coating conditions of the coating units into strict agreement. Thus, instead of performing a parallel processing with a plurality of coating units, a series of film forming processes may be divided into separate time series, the divided processes being carried out successively by using a plurality of separate processing units. Based on this finding, the present invention provides the following construction.

A substrate processing apparatus, according to the invention, comprises a coating section for forming a film of coating solution on a substrate, wherein the coating section performs a series of film forming processes including a coverage process for supplying a coating solution to the substrate and covering a surface of the substrate with the coating solution, a leveling process for making the coating solution on the substrate into a film, and a drying process for drying the film of coating solution formed on the substrate, the coating section including a plurality of separate processing units for successively performing the series of film forming processes as divided into separate time series.

The substrate processing apparatus processes all substrates with the same coating conditions since a plurality of separate processing units are used for performing a series of film forming processes as divided into separate time series. This minimizes variations in quality among the substrates. Moreover, throughput may be improved since the processing units perform the divided processes concurrently.

The series of film forming processes may be divided in any way. For example, the plurality of separate processing units may include a coverage unit for performing the coverage process, and a leveling and drying unit for performing the leveling process and the drying process on the substrate processed by the coverage unit. The processing units may include a coverage and leveling unit for performing the coverage process and the leveling process, and a drying unit for performing the drying process on the substrate processed by the coverage and leveling unit. The processing units may include a coverage unit for performing the coverage process, a leveling unit for performing the leveling process on the substrate processed by the coverage unit, and a drying unit for performing the drying process on the substrate processed by the leveling unit.

The series of film forming processes may include a removing process for removing unwanted parts of the photoresist solution from the substrate, the coating section including a plurality of separate processing units for successively performing the series of film forming processes including the removing process as divided into separate time series.

The series of film forming processes including the above removing process may also be divided in any way. For example, the plurality of separate processing units may include a coverage unit for performing the coverage process, and a leveling, drying and removing unit for performing the leveling process, the drying process and the removing process. The processing units may include a coverage and leveling unit for performing the coverage process and the leveling process, and a drying and removing unit for performing the drying process and the removing process. The processing units may include a coverage, leveling and drying unit for performing the coverage process, the leveling process and the drying process, and a removing unit for performing the removing process. The processing units may include a coverage unit for performing the coverage process, a leveling unit for performing the leveling process, and a drying and removing unit for performing the drying process and the removing process. The processing units may include a coverage unit for performing the coverage process, a leveling and drying unit for performing the leveling process and the drying process, and a removing unit for performing the removing process. The processing units may include a coverage and leveling unit for performing the coverage process and the leveling process, a drying unit for performing the drying process, and a removing unit for performing the removing process. The processing units may include a coverage unit for performing the coverage process, a leveling unit for performing the leveling process, a drying unit for performing the drying process, and a removing unit for performing the removing process.

The removing process may be an edge rinsing for removing the film of coating solution from edges of the substrate, or a back rinsing for removing the coating solution from a back surface of the substrate.

In another aspect of the invention, a substrate processing apparatus comprises a coating section for forming a film of coating solution on a substrate, a developing section for developing the substrate after a coating process and an exposing process, a heat-treating section for heat-treating the substrate before and after the coating and developing processes, and a transport mechanism for transporting the substrate to each processing section, wherein the coating section performs a series of film forming processes including a coverage process for supplying a coating solution on the substrate and covering a surface of the substrate with the coating solution, a leveling process for making the coating solution on the substrate into a film, and a drying process for drying the film of coating solution formed on the substrate, the coating section including a plurality of separate processing units for successively performing the series of film forming processes as divided into separate time series.

With this substrate processing apparatus, a plurality of separate processing units successively perform a series of film forming processes as divided into separate time series. This stabilizes the quality of substrates, and improves the throughput of the substrate processing apparatus.

Preferably, the coating section further includes a dedicated transport mechanism for transporting the substrate between the plurality of separate processing units. In this case, the main transport mechanism of this substrate processing apparatus transports the substrate between the coating section, developing station and heat-treating section, and the dedicated transport mechanism is used to transport the substrate between the plurality of processing units in the coating section. That is, the dedicated transport mechanism undertakes to transport the substrate in the coating section, to avoid lowering of the throughput of the substrate processing apparatus due to an excessive burden falling on the main transport mechanism.

This specification discloses the following solution also:

(1) A substrate processing apparatus comprising a plurality of processing sections for performing predetermined processes on a substrate, a main transport mechanism for transporting the substrate between the processing sections, and a dedicated transport mechanism for transporting the substrate between certain of the processing sections in place of the main transport mechanism.

Where, for example, a substrate processing apparatus comprises a plurality of processing sections such as a coating section for forming a photoresist film on a substrate, a developing section for developing the substrate, and a heat-treating section for heat-treating the substrate, and a main transport mechanism used to transport the substrate between these processing sections, the transporting speed and substrate transfer speed of the main transport mechanism have upper limits although the processing efficiency of each processing section may be increased. Such upper limits may constrain the throughput of the substrate processing apparatus from being increased above a certain level. In the apparatus (1) noted above, the dedicated transport mechanism bears the duty of transporting the substrate between particular processing sections. This reduces the burden on the main transport mechanism, thereby improving the throughput of the substrate processing apparatus.

(2) A substrate processing apparatus as defined in (1) above, wherein the plurality of processing sections are arranged in vertical stages, the main transport mechanism being vertically movable for transporting the substrate at least between upper and lower processing sections, and the dedicated transport mechanism being used to transport the substrate between particular processing sections arranged at the same height.

With the apparatus (2) noted above, since the dedicated transport mechanism is used to transport the substrate between particular processing sections arranged at the same height, the substrate may be transported quickly between the particular processing sections. The dedicated transport mechanism may easily avoid interference with the main transport mechanism which moves vertically.

(3) A substrate processing apparatus as defined in (2) above, wherein the particular processing sections arranged at the same height are separate processing units for performing a series of film forming processes including a coverage process to supply a coating solution to substrate and cover a surface of the substrate with the coating solution, a leveling process for making the coating solution into a film on the substrate, and a drying process for drying the film of coating solution formed on the substrate, as divided into separate time series, the dedicated transport mechanism being used to transport the substrate between the separate processing units.

(4) A substrate processing apparatus as defined in (2) above, wherein the particular processing sections arranged at the same height are separate processing units for performing a series of film forming processes including a coverage process to supply a coating solution to substrate and cover a surface of the substrate with the coating solution, a leveling process for making the coating solution into a film on the substrate, a drying process for drying the film of coating solution formed on the substrate, and a removing process for removing unwanted parts of the coating solution from the substrate, as divided into separate time series, the dedicated transport mechanism being used to transport the substrate between the separate processing units.

With the apparatus (3) or (4) noted above, the dedicated transport mechanism transports the substrate between the plurality of processing units which perform the series of film forming processes as divided into separate time series. This reduces the burden on the main transport mechanism, and also avoids an inconvenience of contaminating other substrates with the coating solution adhering to the main transport mechanism as a result of transporting the substrate still in the course of forming a film.

To overcome the disadvantage noted in section (II) above, Inventors have made intensive research and obtained the following finding.

It has been thought heretofore that a cause of defective exposure is only on the front surface of a substrate. By thinking from a different angle, various experiments have been carried out on an assumption that a cause of defective exposure is also on the back surface of the substrate. The back surface of the substrate has been found to have unwanted parts of a coating solution having moved thereto when supplied to the front surface of the substrate, marks made when the back surface of the substrate is held by a suction type vacuum chuck in a process preceding an exposing process, or stains such as particles adhering to the back surface. It has been confirmed that defective exposure is reduced by removing such marks and stains from the back surface of the substrate. As a well-known technique of removing stains from the back surface of the substrate, for example, back rinsing may be carried out to deliver a cleaning solution from a nozzle opposite the back surface to wash the stains away from the back surface of the substrate. However, the coating processing and the cleaning process such as back rinsing noted above are carried out in series. There is a limitation to removal of stains from the back surface of the substrate by such a series processing. Further, stains may be transferred from a processed substrate to a support table on which the substrate is placed, and such stains may adhere even to a succeeding substrate to be processed. On the other hand, it is conceivable to improve the ability of removing stains adhering to the back surface of the substrate by regularly cleaning the substrate processing apparatus, particularly the support table in the coating section. However, this is a time-consuming operation involving moving of peripherals. To reduce the chance of defective exposure in the exposing process performed subsequently, the coating process and the cleaning process for removing stains from the back surface of the substrate may be performed separately. Based on this finding, the present invention provides the following construction.

A substrate processing apparatus, according to the invention, comprises a coating section including a first processing section for supplying a coating solution to a substrate, and a second processing section for supplying a cleaning solution to the substrate processed by the first processing section, wherein the first processing section includes a first substrate holding device for holding the substrate in horizontal posture while supporting a first support area on a back surface of the substrate, and a coating solution supplying device for supplying the coating solution to a front surface of the substrate held by the first substrate holding device; and the second processing section includes a second substrate holding device for holding the substrate in horizontal posture while supporting a second support area different from the first support area, and a cleaning solution supplying device for supplying the cleaning solution to clean a part or whole of the first support area on the back surface of the substrate held by the second substrate holding device.

With the substrate processing apparatus according to the invention, the first processing section is assigned with the coating process for supplying the coating solution from the coating solution supplying device to the front surface of the substrate to coat the front surface, and the second processing section is assigned with the cleaning process for supplying the cleaning solution from the cleaning solution supplying device to the back surface of the substrate to remove stains from the back surface of the substrate. Thus, the coating process and cleaning process are performed separately by the first and second processing sections, respectively. Further, the first processing section includes the first substrate holding device for holding the substrate in horizontal posture while supporting a first support area on the back surface of the substrate. The second processing section includes the second substrate holding device for holding the substrate in horizontal posture while supporting a second support area different from the first support area. The cleaning solution is supplied to clean a part or whole of the first support area on the back surface of the substrate held by the second substrate holding device. This improves the ability to remove stains from the back surface of the substrate. As a result, the substrate may be coated with high precision.

As a technique for the second substrate holding device to support the second support area different from the first support area, for example, the first substrate holding device may be constructed to hold the substrate in horizontal posture by supporting a central portion of the back surface of the substrate, and the second substrate holding device may be constructed to hold the substrate in horizontal posture by supporting edges of the substrate. Alternatively, the first substrate holding device may be constructed to hold the substrate in horizontal posture by supporting the first support area including a central portion of the back surface of the substrate, and the second substrate holding device may be constructed to hold the substrate in horizontal posture by supporting the second support area including the central portion of the back surface of the substrate.

To support the central portion of the back surface of the substrate, the first substrate holding device may be a vacuum chuck for holding the substrate in horizontal posture by suction-supporting the central portion of the back surface of the substrate.

As the latter technique, for example, the second substrate holding device may support the second support area different from the first support area, such that the first and second support areas are staggered relative to each other while including the central portion on the back surface of the substrate. Alternatively, the first and second substrate holding devices may be constructed such that the second support area is smaller than the first support area.

For the purpose of making the second support area smaller than the first support area, specifically, each of the first and second substrate holding devices may comprise a vacuum chuck for holding the substrate in horizontal posture by suction-supporting a central portion on the back surface of the substrate, the vacuum chuck acting as the second substrate holding device having a smaller diameter than the vacuum chuck acting as the first substrate holding device.

As a different technique for the second substrate holding device to support the second support area different from the first support area, for example, the first or second substrate holding device supports a plurality of locations (e.g. three locations) other than the central portion and edges. Alternatively, the substrate processing apparatus may further comprise a reversing device for turning over the substrate and placing the substrate back in position between the processes in the first and second processing sections, whereby the substrate is turned over by the reversing device so that the second substrate holding device holds the substrate in horizontal posture while supporting the second support area different from the first support area.

The cleaning process for removing stains from the substrate is not limited to the stains adhering to the back surface noted above, but may be applied to stains adhering, for example, to edges on the front surface of the substrate or to edges on the back surface of the substrate (e.g. edge rinsing). In the substrate processing apparatus according to the present invention, such edge cleaning process may be assigned to the first process section or second process section. For example, at least one of the first processing section and the second processing section may include an edge cleaning device for cleaning edges of the substrate.

In one preferred example of including the edge cleaning device in at least one of the first processing section and the second processing section, the edge cleaning device is disposed in the first processing section, the apparatus further comprising a first transport device for supporting the edges of the substrate and transporting the substrate between the first processing section and the second processing section, the first processing section performing a coating process on the front surface of the substrate, and an edge cleaning process for cleaning the edges of the substrate, the first transporting device transporting the substrate, after the coating process and the edge cleaning process, from the first processing section to the second processing section, and the second processing section performing a cleaning process for cleaning the part or whole of the first support area on the back surface of the substrate received from the first transport device.

The above feature is particularly useful with a transport device such as the first transport device that supports the edges of the substrate and transports the substrate between the first processing section and second processing section. That is, the first processing section first carries out the coating process for coating the surface of the substrate, and the edge rinsing process for removing stains from the edges of the substrate. Thus, no stains are present on the edges of the substrate when the first transport device supports the edges of the substrate and transports the substrate to the second processing section. Where the substrate is transported to the second processing section without carrying out the edge rinsing process in the first processing section to remove the stains from the edges of the substrate, the stains adhering to the edges of the substrate will not only adhere to the first transport device, but also affect, by staining, even the second processing section through the first transport device. The above construction effectively reduces contamination of the first transport device and the adverse effect on the second processing section.

In a further aspect of the invention, a substrate processing apparatus comprises a coating section for forming a film of coating solution on a substrate; wherein the coating section includes a first processing section for supplying a coating solution to the substrate, and a second processing section for supplying a cleaning solution to the substrate processed by the first processing section; the apparatus further comprising a second transport device for transporting the substrate between a plurality of processing sections including the first and second processing sections, the first processing section including a first substrate holding device for holding the substrate in horizontal posture while supporting a first support area on a back surface of the substrate, and a coating solution supplying device for supplying the coating solution to a front surface of the substrate held by the first substrate holding device; and the second processing section including a second substrate holding device for holding the substrate in horizontal posture while supporting a second support area different from the first support area, and a cleaning solution supplying device for supplying the cleaning solution to clean a part or whole of the first support area on the back surface of the substrate held by the second substrate holding device.

The above apparatus includes the second transport device for transporting the substrate between a plurality of processing sections including the first and second processing sections. This enables an efficient performance of a series of substrate processes including the coating process and the cleaning process for removing stains from the back surface of the substrate.

In a still further aspect of the invention, a substrate processing apparatus comprises a coating section for forming a film of coating solution on a substrate; wherein the coating section includes a first processing section for supplying a coating solution to the substrate, and a second processing section for supplying a cleaning solution to the substrate processed by the first processing section; the apparatus further comprising a second transport device for transporting the substrate between a plurality of processing sections including the first and second processing sections, an external processing apparatus connected to the substrate processing apparatus, and an interface for relaying transfer of the substrate between the processing sections and the external processing apparatus; the first processing section including a first substrate holding device for holding the substrate in horizontal posture while supporting a first support area on a back surface of the substrate, and a coating solution supplying device for supplying the coating solution to a front surface of the substrate held by the first substrate holding device; and the second processing section including a second substrate holding device for holding the substrate in horizontal posture while supporting a second support area different from the first support area, and a cleaning solution supplying device for supplying the cleaning solution to clean a part or whole of the first support area on the back surface of the substrate held by the second substrate holding device.

The above apparatus includes the external processing apparatus connected to the substrate processing apparatus, and the interface for relaying transfer of the substrate between the processing sections and the external processing apparatus. The substrate coated with high precision in the coating section is transported through the interface to the external processing apparatus. Since the substrate is coated with high precision, the substrate processing may be performed efficiently in the external processing apparatus.

The external processing apparatus may be an exposing apparatus for exposing the substrate after a coating process. Where the external processing apparatus is an exposing apparatus, since the substrate is coated with high precision in the coating section, defective exposure due to stains adhering to the back surface of the substrate may be reduced, compared with the prior art.

The above apparatus overcomes the disadvantage noted in section (II) above, that is to remove stains from the back surface of the substrate. However, the cleaning solution may be applied only to the back surface of the substrate. Unless the cleaning solution is applied to peripheral surfaces of the substrate, stains adhering to the peripheral surfaces may not be removed therefrom. This specification discloses a substrate processing apparatus different from the above apparatus, based on the above finding, to remove stains from the peripheral surfaces of the substrate efficiently, as follows:

(5) A substrate processing apparatus comprising a coating section including a third processing section for supplying a coating solution to a substrate, and a second processing section for supplying a cleaning solution to the substrate processed by the first processing section, wherein the third processing section includes a third substrate holding device for holding the substrate in horizontal posture while supporting peripheral surfaces of the substrate, and a coating solution supplying device for supplying the coating solution to a front surface of the substrate held by the third substrate holding device; and the second processing section includes a second substrate holding device for holding the substrate in horizontal posture while supporting areas different from the peripheral surfaces of the substrate supported by the third substrate holding device, and a cleaning solution supplying device for supplying the cleaning solution to clean at least the peripheral surfaces of the substrate supported by the third substrate holding device.

In the foregoing apparatus for overcoming the disadvantage (II), the back surface of the substrate may be replaced with the peripheral surfaces of the substrate, that is the construction as set forth in the invention (5) above, stains may be removed from the peripheral surfaces of the substrate. The term "peripheral surfaces of the substrate" used herein is intended to mean vertical surfaces, or side surfaces, bridging the front surface and back surface which are horizontal surfaces. The term "edges of the substrate" is intended to mean edges of the front surface and back surface including the peripheral surfaces of the substrate.

To overcome the disadvantage (III) noted hereinbefore, the present invention provides a substrate processing apparatus comprising a plurality of processing units for performing one stage of operation in which a processing object is in form of a particular substance on a substrate or in a particular form of energy relating to the substrate, the one stage being divided into a plurality of processes each involving an increase or decrease of the processing object; and a transport mechanism for transporting the substrate to the plurality of processing units; at least the processing units including a plurality of first partial processing units, and a second partial processing unit for performing a partial process having a shorter processing time than a process performed by each of the first partial processing units; the plurality of first partial processing units performing a parallel processing.

Generally, the plurality of processing units in the present invention share processes involving an increase or decrease of "processing objects", and a chain of such processes constitutes one stage. The "processing objects" here include a "chemical" in a "chemical process", "heat" in a "heat treatment" (heating and cooling), "foreign matters" in a "cleaning process", "moisture" on wafers in a "drying process", and a "layer to be exposed" in an "exposing process".

With the substrate processing apparatus according to the invention, a plurality of processing units perform one stage of operation in which a processing object is in form of a particular substance on a substrate or in a particular form of energy relating to the substrate, the one stage being divided into a plurality of processes performed concurrently and each involving an increase or decrease of the processing object. This feature can avoid throughput being limited by a process requiring a long processing time where a difference in processing time occurs between the partial processing units.

For example, the processing object may be a chemical applied to the substrate, the first partial processing units performing a chemical coating process on the substrate. Then, throughput may be maintained even where, with the increase in substrate size, the chemical coating process tends to require an extended processing time. Particularly where the chemical is a resist, throughput may be maintained for a resist coating process which forms an important part of substrate processing.

In one preferred example of chemical coating process, the second partial processing unit performs a rinsing process including a back rinsing process for removing the chemical from the substrate. With the second partial processing unit performing the rinsing process including the back rinsing process, the other processing units may be simplified. Preferably, each of the first partial processing units and the second partial processing unit has a spin chuck for holding and spinning the substrate, the spin chuck of the second partial processing unit being smaller in diameter than the spin chuck of each of the first partial processing units. Since the spin chuck of the second partial processing unit is smaller than the spin chuck of each of the first partial processing units, particles having adhered to the back surface in each first partial processing unit may be washed away in the larger quantity for the smaller chuck, to reduce particles on the back surface.

Similarly, it is preferred in performing the chemical coating process that each of the first partial processing units performs a first edge rinsing process for edges of the substrate coated with the chemical. With each of the first partial processing units performing the first edge rinsing process for edges of the substrate coated with the chemical, a defective transport may be prevented from occurring when the substrate is transported from each of the first partial processing units. Preferably, the rinsing process includes a second edge rinsing process, the first edge rinsing process covering a smaller range on the substrate than the second edge rinsing process. With this feature, the edge rinsing function of each first processing unit is simplified to simplify the construction of the first processing unit.

In another preferred embodiment for performing the chemical coating process, the substrate processing apparatus further comprises a device for controlling at least one of temperature and humidity only in a space accommodating the first partial processing units, to be within a predetermined range. This apparatus has a simplified construction compared with the case of controlling the temperature and humidity of all the spaces in the apparatus.

In a further preferred embodiment for performing the chemical coating process, the substrate processing apparatus further comprises a chemical nozzle for delivering the chemical, the plurality of first partial processing units sharing the chemical nozzle. With the chemical nozzle shared by the plurality of first partial processing units, there is no need to provide a chemical nozzle for each first partial processing unit. Thus, the apparatus may be reduced in cost, while reducing individual differences among the substrates manufactured.

In the substrate processing apparatus for overcoming the disadvantage (III) noted above, it is preferred that the plurality of first partial processing units are spatially isolated on a basis of processing units performing the same process, at least during the process. With this construction, the substrate processed in each first processing unit is prevented from being affected by other processes performed separately.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

First Embodiment

Figure 1:
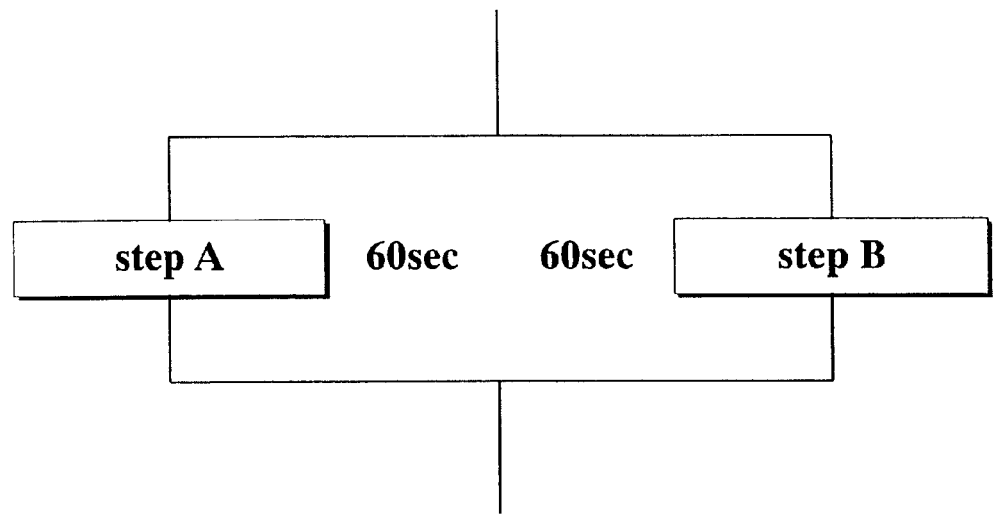
FIG. 1 is a processing diagram of a conventional substrate processing apparatus.
Figure 2:
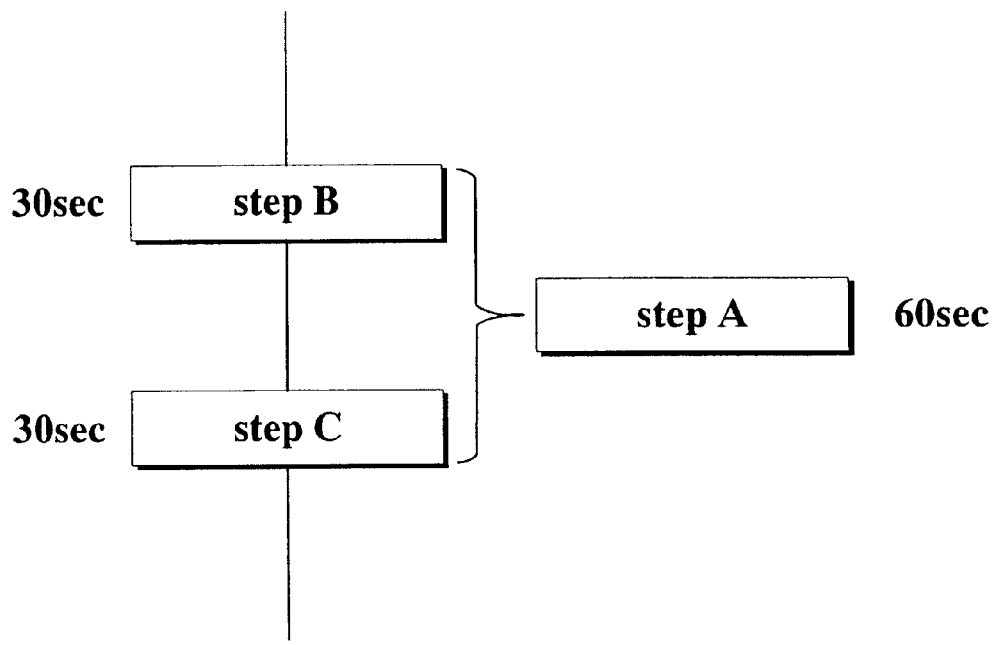
FIG. 2 is a processing diagram of another conventional substrate processing apparatus.
Figure 3:
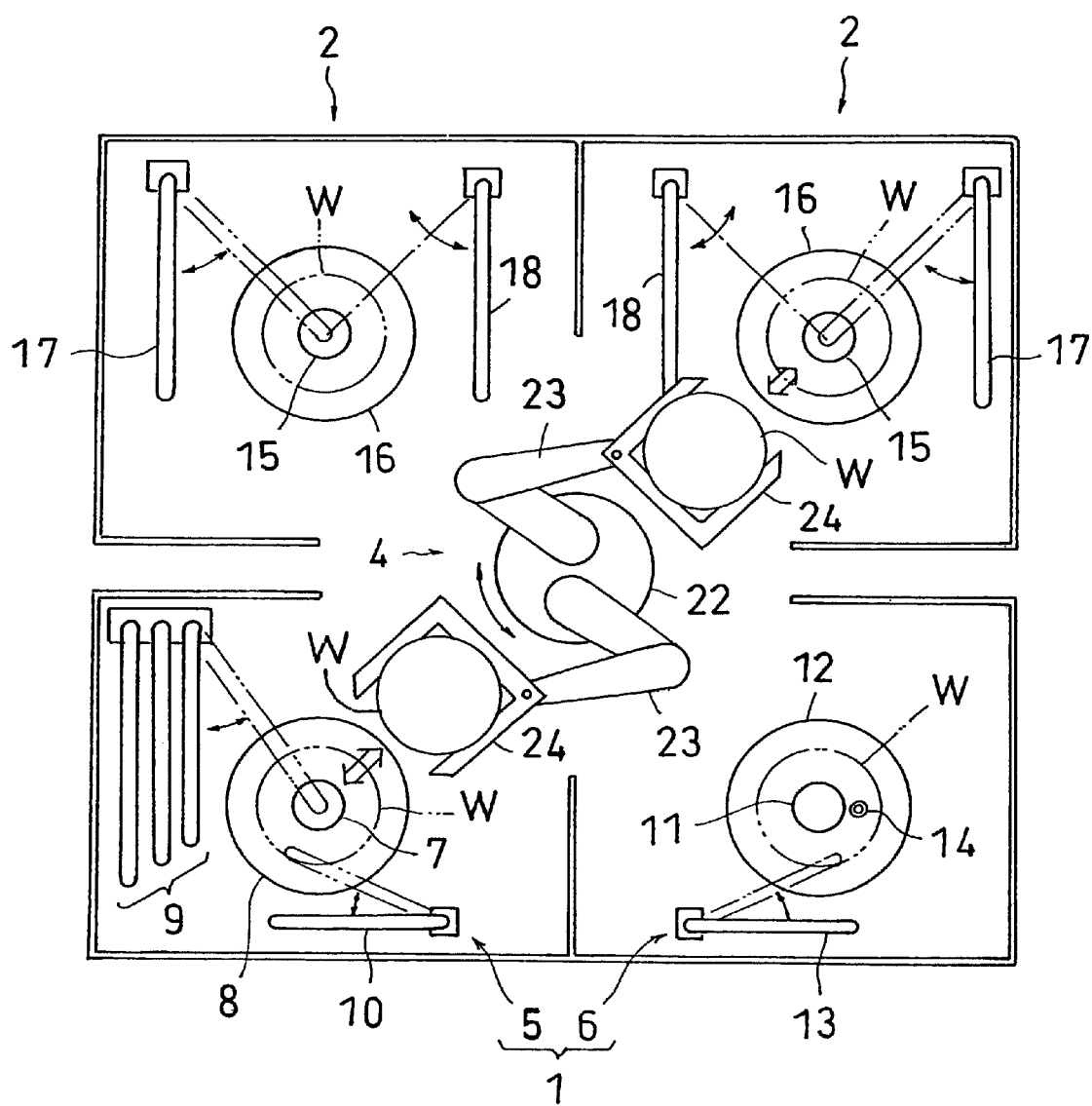
FIG. 3 is a plan view of a substrate processing apparatus having a coating section according to the present invention.
Figure 4:
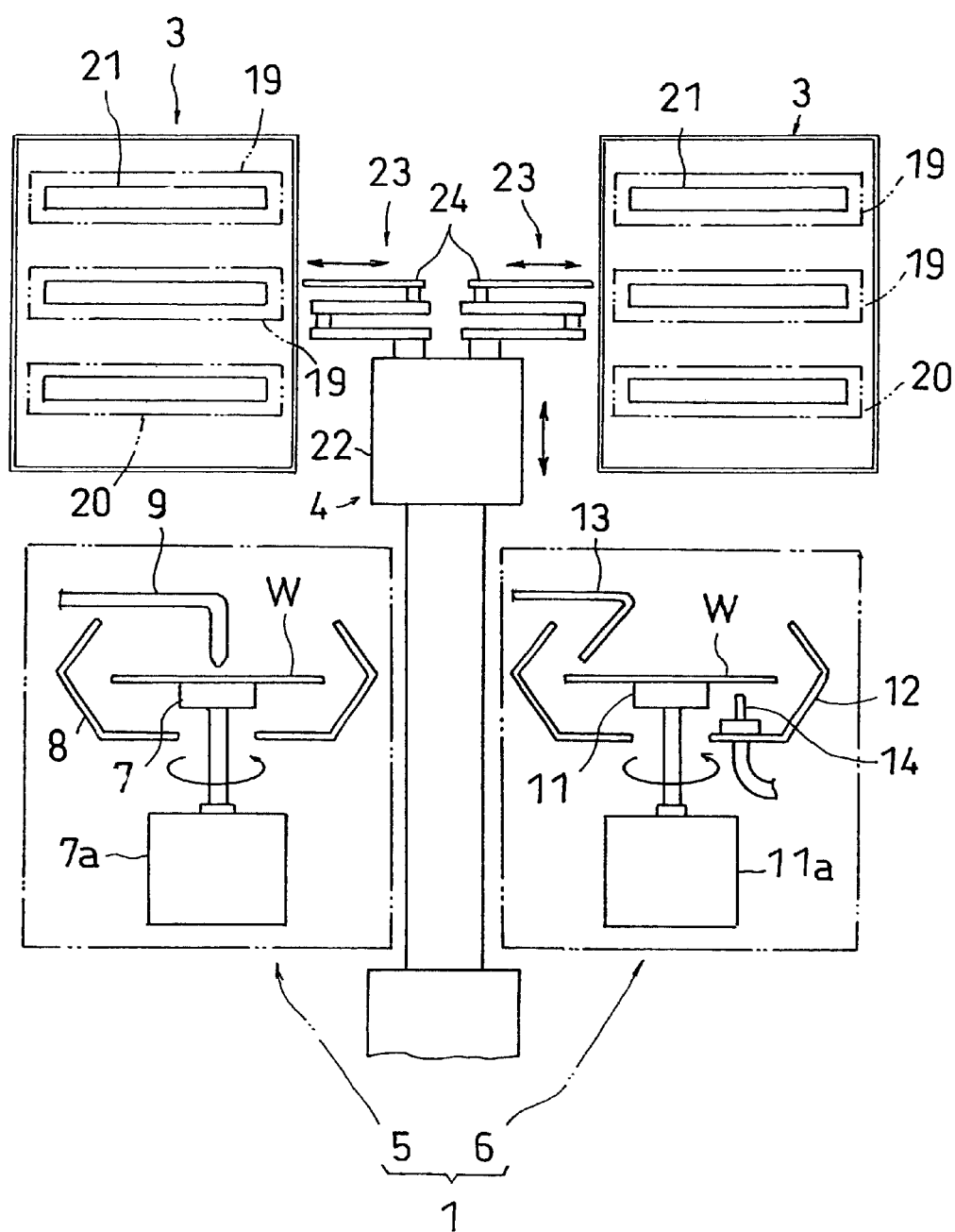
FIG. 4 is a front view of the apparatus shown in FIG. 3.

FIG. 3 is a plan view of a substrate processing apparatus having a coating section according to the invention. FIG. 4 is a front view of the apparatus.

This substrate processing apparatus includes a coating section 1 for forming films of a coating solution such as a photoresist solution on substrates such as semiconductor wafers W, developing sections 2 for developing the wafers W coated with the films and exposed by an exposing apparatus not shown, heat-treating sections 3 for heat-treating the wafers W before and after the coating and developing processes, and a transport mechanism 4 for transporting the wafers W to and from the respective processing sections 1, 2 and 3. The processing sections 1, 2 and 3 are arranged in upper and lower stages around the transport mechanism 4. The coating section 1 and developing sections 2 are arranged in the lower stage, while the heat-treating sections 3 are arranged in the upper stage. The construction of each section will particularly be described hereinafter.

Figure 5A:
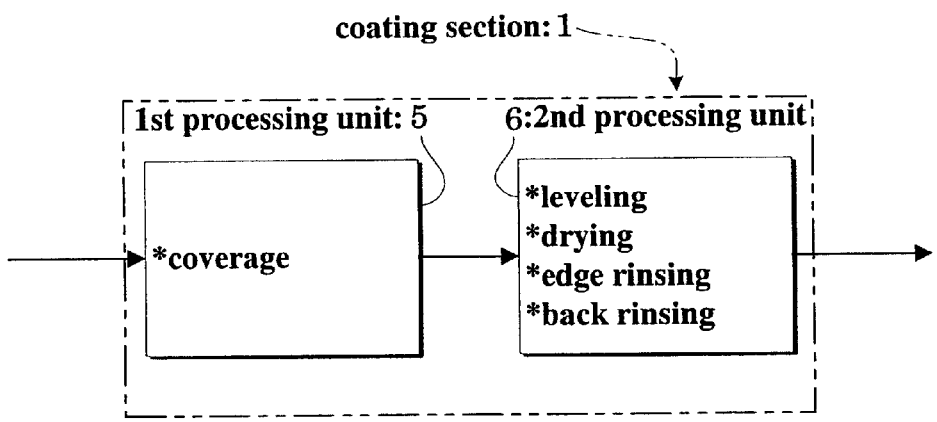
FIG. 5A is a block diagram of processes performed by different processing units (a coverage process performed by a first processing unit, and leveling, drying, edge rinsing and back rinsing processes performed by a second processing unit)

The coating section 1 includes separate, first and second processing units 5 and 6 for successively carrying out various film forming processes in two separate time series. These processes are a coverage process for supplying the photoresist solution to each wafer W and covering the surface of wafer W with the photoresist solution, a leveling process for leveling the photoresist solution to a film on the wafer W, a drying process for drying the film of coating solution formed on the wafer W, and a removing process for removing unwanted parts of the photoresist solution from the wafer W. In this embodiment, as shown in FIG. 5A, the first processing unit 5 mainly performs the coverage process, and the second processing unit 6 performs the leveling, drying and removing (edge rinsing and back rinsing) processes.

The first processing unit 5, which corresponds to the coverage unit of the present invention, has a spin chuck 7 driven by a motor 7a to spin while suction-supporting a wafer W in horizontal posture. The spin chuck 7 is surrounded by a scatter preventive cup 8 for receiving and draining the photoresist solution scattering from the wafer W. Arranged beside the scatter preventive cup 8 are a plurality of resist supply nozzles 9 allocated to different types of photoresist solution, and a solvent supply nozzle 10 for use in edge rinsing.

As does the first processing unit 5, the second processing unit 6, which corresponds to the leveling, drying and removing unit of the present invention, has a spin chuck 11 driven by a motor 11a, and a scatter preventive cup 12. A solvent supply nozzle 13 is disposed beside the scatter preventive cup 12 for use in edge rinsing. Further, a solvent supply nozzle 14 for back rinsing is disposed opposite the back surface of wafer W supported by the spin chuck 11.

The two developing sections 2 have the same construction. As does the coating section 1, each developing section 2 has a spin chuck 15 and a scatter preventive cup 16. A developer supply nozzle 17 and a cleaning solution supply nozzle 18 are arranged beside the scatter preventive cup 16.

Each heat-treating section 3 has a plurality of heating units 19 for heating wafers W before and after the coating process and developing process, and a cooling unit 20 for cooling the heated wafers W back to room temperature. Each unit 19 or 20 is constructed to perform the heat treatment of wafer W placed on a heat-treating plate not shown. Numeral 21 in FIG. 4 denotes an opening formed in each unit 19 or 20 for loading and unloading wafers W.

The transport mechanism 4 has a vertically movable and rotatable base 22, and two articulated arms 23 mounted on the base 22 to be driven independently of each other. Each articulated arm 23 has a supporting device 24 attached to a distal end thereof for horizontally supporting a wafer W. Each articulated arm 23 is extendible and contractible.

Operation of the substrate processing apparatus having the above construction will be described next.

A: Heat Treatment (1)

First, the two articulated arms 23 of the transport mechanism 4 receive wafers W to be processed from an indexer unit not shown (one of the wafers being referenced W1 and the other referenced W2 hereinafter). The wafer W1 is loaded into a predetermined one of the heating units 19. This heating unit 19 provides an adhesion treatment (resist adhesion promoting treatment) for the wafer W1. When one of the articulated arms 23 carries the wafer W1 having received the adhesion treatment out of the heating unit 19, the other articulated arm 23 carries the wafer W2 into the heating unit 19. The transport mechanism 4 loads the wafer W1 taken out of the heating unit 19 into the cooling unit 20. The cooling unit 20 cools the wafer W1 to room temperature.

B: Coverage Process

After the heat treatment, the transport mechanism 4 transports the wafer W1 to the first processing unit 5 in the coating section 1. The spin chuck 7 supports the wafer W1 by suction. A predetermined one of the resist supply nozzles 9 moves to a predetermined position and supplies the photoresist solution to a central region of wafer W1. The spin chuck 7 spins at a first spinning speed to spread the photoresist solution radially outwardly. As a result, the surface of wafer W1 is covered by the photoresist solution. At this time, the solvent supply nozzle 10 supplies a solvent to edges of the spinning wafer W1, thereby washing the photoresist solution away from the edges of wafer W1. While the coverage process is being performed for the wafer W1, the transport mechanism 4 transfers the wafer W2 from the heating unit 19 to the cooling unit 20, and loads a next wafer W3 into the heating unit 19.

C: Leveling, Drying, Edge Rinsing and Back Rinsing Processes

After the coverage process, the transport mechanism 4 transports the wafer W1 to the second processing unit 6 in the coating section 1. Since the photoresist solution is removed from the edges of wafer W1 by the first processing unit 5, the supporting device 24 of the transport mechanism 4 is never contaminated by the photoresist solution. The spin chuck 11 suction-supports the wafer W1 transported to the second processing unit 6. The spin chuck 11 spins at a second spinning speed to make the photoresist solution into a film on the wafer W1 (leveling process). The spin chuck 11 continues to spin to dispel the solvent from within the photoresist film on the wafer W1, thereby drying the photoresist film (drying process). Next, the solvent supply nozzle 13 supplies the solvent to the edges of spinning wafer W, thereby washing the photoresist solution away from the edges of wafer W1 (edge rinsing). The solvent supply nozzle 14 supplies the solvent to the back surface of spinning wafer W1. This washes away photoresist having drifted round and adhered to the back surface of wafer W1 (back rinsing).

While the second processing unit 6 is performing the series of processes for the wafer W1, the transport mechanism 4 loads the cooled wafer W2 into the first processing unit 5. The first processing unit 5 performs the coverage process for the wafer W2 in parallel with the processes provided for the wafer W1 in the second processing unit 6. Subsequent processes are likewise carried out concurrently by the first processing unit 5 and second processing unit 6. While the following description is directed to the processing of wafer W1, the processes are performed concurrently in the processing sections 1, 2 and 3 as described above.

D: Heat Treatment (2)

After the processes in the second processing unit 6, the transport mechanism 4 transports the wafer W1 to one of the heat-treating sections 3. This heat-treating section 3 provides heating and cooling treatment for the wafer W1 by using appropriate heating unit 19 and cooling unit 20.

After the above heat treatment, the transport mechanism 4 transfers the wafer W1 to the exposing apparatus, not shown, connected to this substrate processing apparatus. The wafer W1 with circuit patterns printed thereon by the exposing apparatus is transferred back by the transport mechanism 4.

E: Heat Treatment (3)

The transport mechanism 4 transports the wafer W1 to one of the heat-treating sections 3. This heat-treating section 3 provides heating and cooling treatment for the wafer W1 by using appropriate heating unit 19 and cooling unit 20.

F: Developing Process

After the above heat treatment, the transport mechanism 4 transports the wafer W1 to one of the developing sections 2. The spin chuck 15 supports the wafer W1 by suction. The developer supply nozzle 17 moves to a predetermined position and supplies a developer to the central region of wafer W1, thereby forming a puddle of the developer on the wafer W1. While the wafer W1 is maintained still, the photoresist film is developed. After the developing process, the wafer W1 is spun at high speed to dispel the developer from the wafer W1. Then, the wafer W1 is cleaned by a cleaning solution supplied thereto from the cleaning solution supply nozzle 18.

After the cleaning process, the cleaning solution supply is stopped, and the wafer W1 is dried by being spun continuously. A further heating and cooling treatment is given to the wafer W1 as necessary, and then the transport mechanism 4 returns the wafer W1 to the indexer unit.

With the substrate processing apparatus in this embodiment, as described above, while the first processing unit 5 performs the coverage process, the second processing unit 6 performs the leveling, drying, edge rinsing and back rinsing processes. Thus, all wafers W will be processed with the same coating conditions. This minimizes variations in quality among the wafers W, such as in the precision of patterns developed. Moreover, throughput of substrate processing may be improved since the first processing unit 5 and second processing unit 6 are operable to perform the various processes concurrently.

Figure 5B:
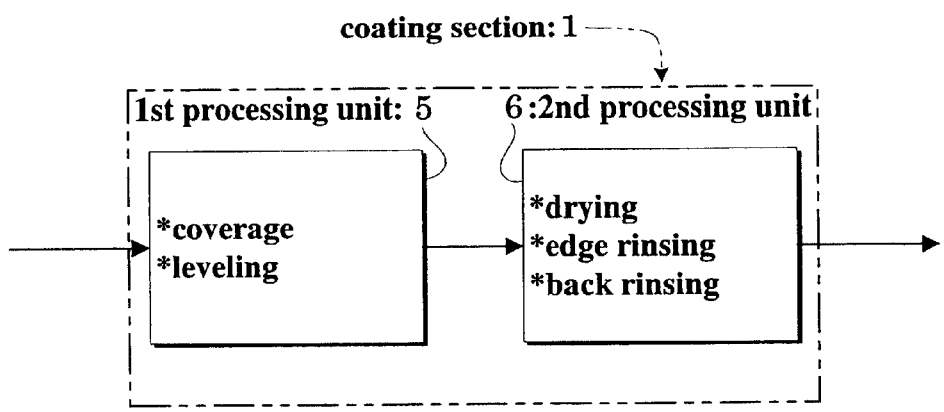
FIG. 5B is a block diagram of processes performed by different processing units (the coverage and leveling processes performed by the first processing unit, and the drying, edge rinsing and back rinsing processes performed by the second processing unit)

In the above embodiment, the first processing unit 5 performs the coverage process, while the second processing unit 6 performs the leveling, drying, edge rinsing and back rinsing processes. As shown in FIG. 5b, the coverage process and leveling process may be assigned to the first processing unit 5, and the drying and removing (i.e. edge rinsing and back rinsing) processes to the second processing unit 6. In this case, the first processing unit 5 corresponds to the coverage and leveling unit of the present invention, and the second processing unit 6 to the drying and removing unit of the invention.

In reality, a boundary between the leveling process and drying process is not necessarily clear. Thus, the first processing unit 5 may perform part of the leveling process or drying process, with the second processing unit 6 performing the rest.

Second Embodiment

Figure 6:
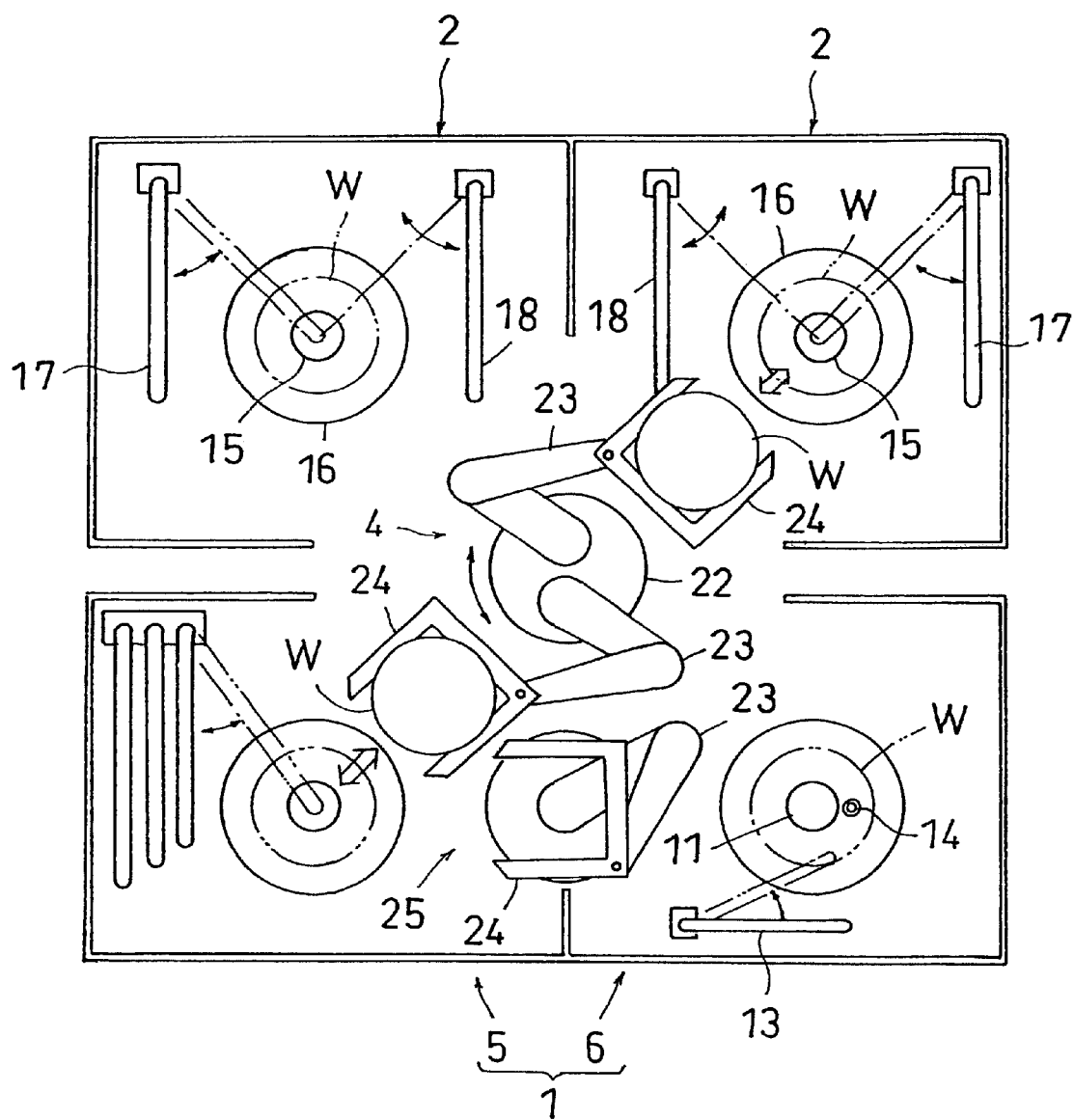
FIG. 6 is a plan view of a substrate processing apparatus in a second embodiment.

FIG. 6 is a plan view of a substrate processing apparatus in the second embodiment.

In the first embodiment, the transport mechanism 4 is used for transporting wafers W from the first processing unit 5 to the second processing unit 6 as well as transporting the wafers W between the different sections 1, 2 and 3. Thus, the transport mechanism 4 bears a corresponding heavy workload. The transport mechanism 4 has limitations in moving speed and wafer loading and unloading speed. With an excessive burden falling on the transport mechanism 4, the restrictions of the transport mechanism 4 will rule out the possibility of improving the throughput of the substrate processing apparatus even if the processing speed of each processing section 1, 2 or 3 is increased. This embodiment, therefore, provides an additional transport mechanism 25 dedicated to transport of wafers W from the first processing unit 5 to the second processing unit 6. As does the transport mechanism 4, the special-purpose transport mechanism 25 includes an extensible and swivelable articulated arm 23 having a supporting device 24 attached to a distal end thereof for supporting a wafer W. The other aspects of the construction are the same as in the first embodiment, and will not be described again. This embodiment may, of course, be modified as is the first embodiment.

The special-purpose transport mechanism 25 is used to transport the wafers W between the first and second processing units 5 and 6 at the same level. Thus, the wafers W may be transported quickly between the first and second processing units 5 and 6. The special-purpose transport mechanism 25 may easily be clear of the transport mechanism 4 moving up and down.

Further, according to this embodiment, since the special-purpose transport mechanism 25 is used to transport the wafers W between the first and second processing units 5 and 6, and since the wafers W are cleaned in the second processing unit 6, the main transport mechanism 4 is never contaminated by the photoresist solution even when the supporting device 24 of the special-purpose transport mechanism 25 is contaminated by the photoresist solution while transporting the wafers W. This is effective for avoiding the inconvenience of the wafers W being contaminated through the transport mechanism 4. Thus, this embodiment can dispense with the solvent supply nozzle 10 for edge rinsing of the first processing unit 5 in the first embodiment.

Third Embodiment

Figure 7:
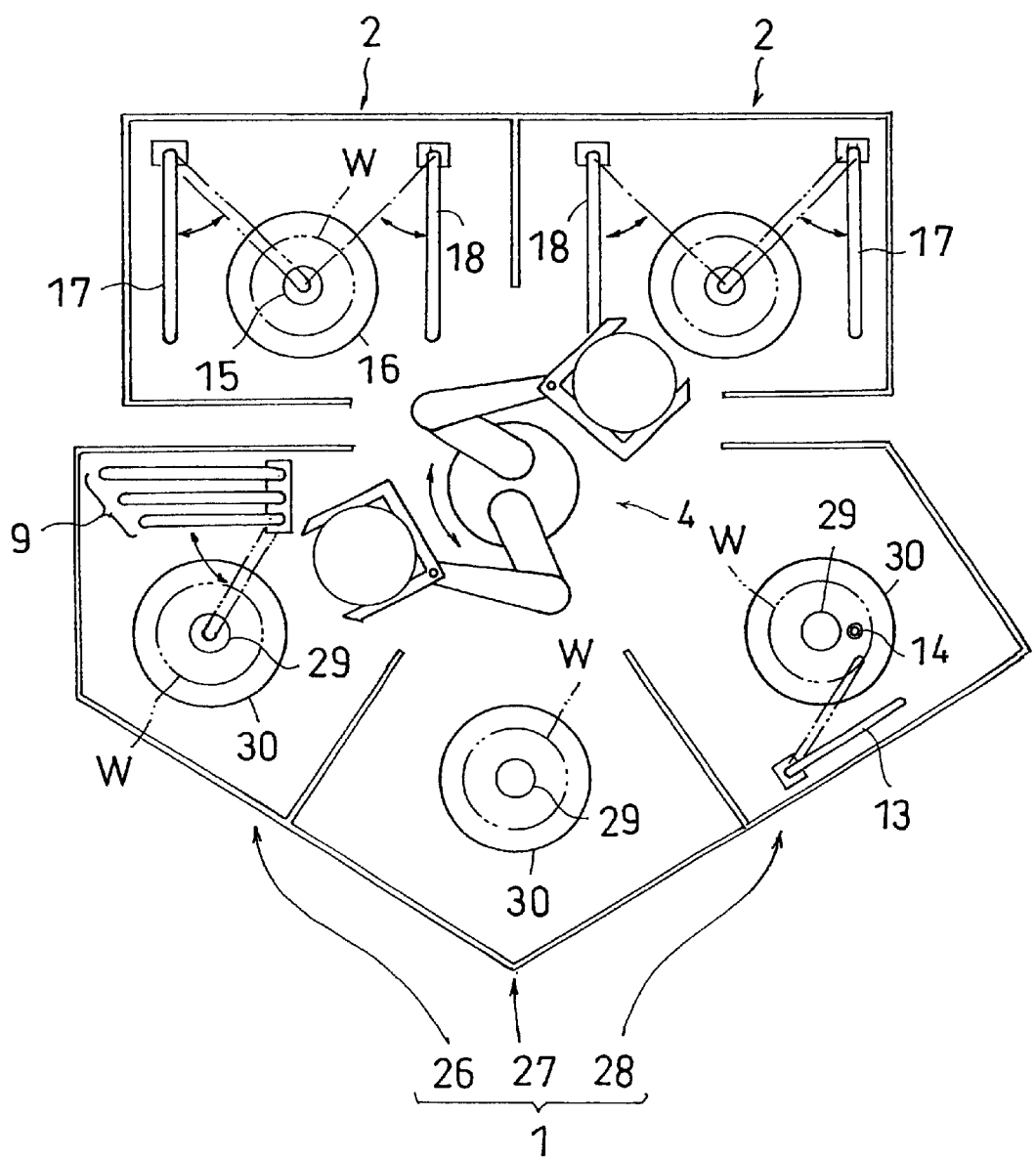
FIG. 7 is a plan view of a substrate processing apparatus in a third embodiment.

FIG. 7 is a plan view of a substrate processing apparatus in the third embodiment.

In first and second embodiments, the two separate, first and second processing units 5 and 6 successively carry out the film forming processes in two separate time series. In this embodiment, three separate, first, second and third processing units 26, 27 and 28 successively carry out the film forming processes in three separate time series. The other aspects of the construction are the same as in the first embodiment, and will not be described again.

Figure 5C:
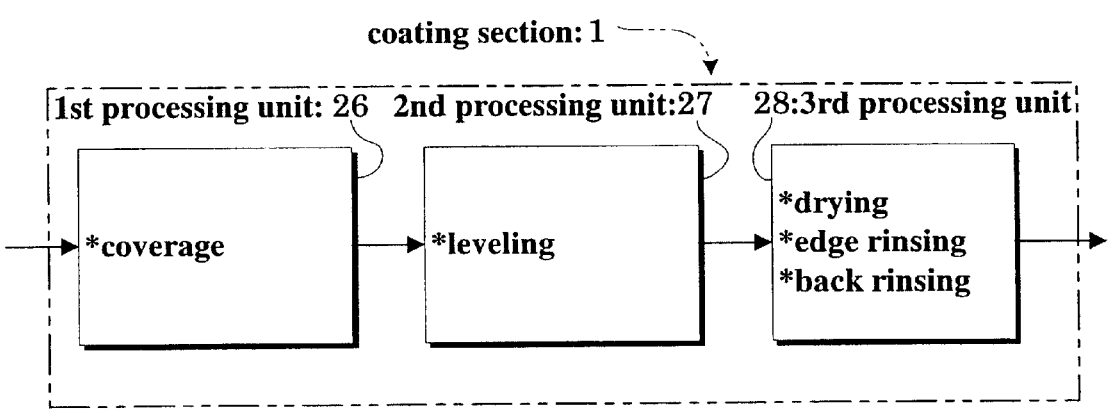
FIG. 5C is a block diagram of processes performed by different processing units (the coverage process performed by the first processing unit, the leveling process performed by the second processing unit, and the drying, edge rinsing and back rinsing processes performed by a third processing unit)

Each of the processing units 26, 27 and 28 has a spin chuck 29 and a scatter preventive cup 30. The first processing unit 26 includes a plurality of resist supply nozzles 9 allocated to different types of photoresist solution. As shown in FIG. 5C, the first processing unit 26, which corresponds to the coverage unit of the present invention, performs the coverage process for supplying the photoresist solution from a predetermined one of the resist supply nozzles 9 to a wafer W supported by the spin chuck 29 to cover the surface of wafer W with the photoresist solution. The second processing unit 27, which corresponds to the leveling unit of the invention, performs the leveling process for spinning the wafer W after the coverage process at a predetermined spinning speed to make the photoresist solution into a film. The third processing unit 28 which corresponds to the drying and removing unit of the invention, performs the drying process for drying the photoresist film and the edge rinsing and back rinsing of the wafer W while spinning the wafer W after the leveling process at a predetermined spinning speed.

In this embodiment also, all wafers W are processed with the same coating conditions. Moreover, the throughput of substrate processing may be further improved since the three, first, second and third processing units 26, 27 and 28 perform the various film forming processes concurrently.

In this embodiment, the main transport mechanism 4 is used to transport the wafers between the processing units 26, 27 and 28. To prevent the photoresist solution from adhering to the supporting devices 24 of the transport mechanism 4, the first processing unit 26 and second processing unit 27 may include solvent supply nozzles 10 for edge rinsing, as does the first processing unit 5 in the first embodiment. Alternatively, special transport mechanisms 25, as in the second embodiment, may be used to transport wafers W between the first and second processing units 26 and 27 and between the second and third processing units 27 and 28.

Fourth Embodiment

Figure 8:
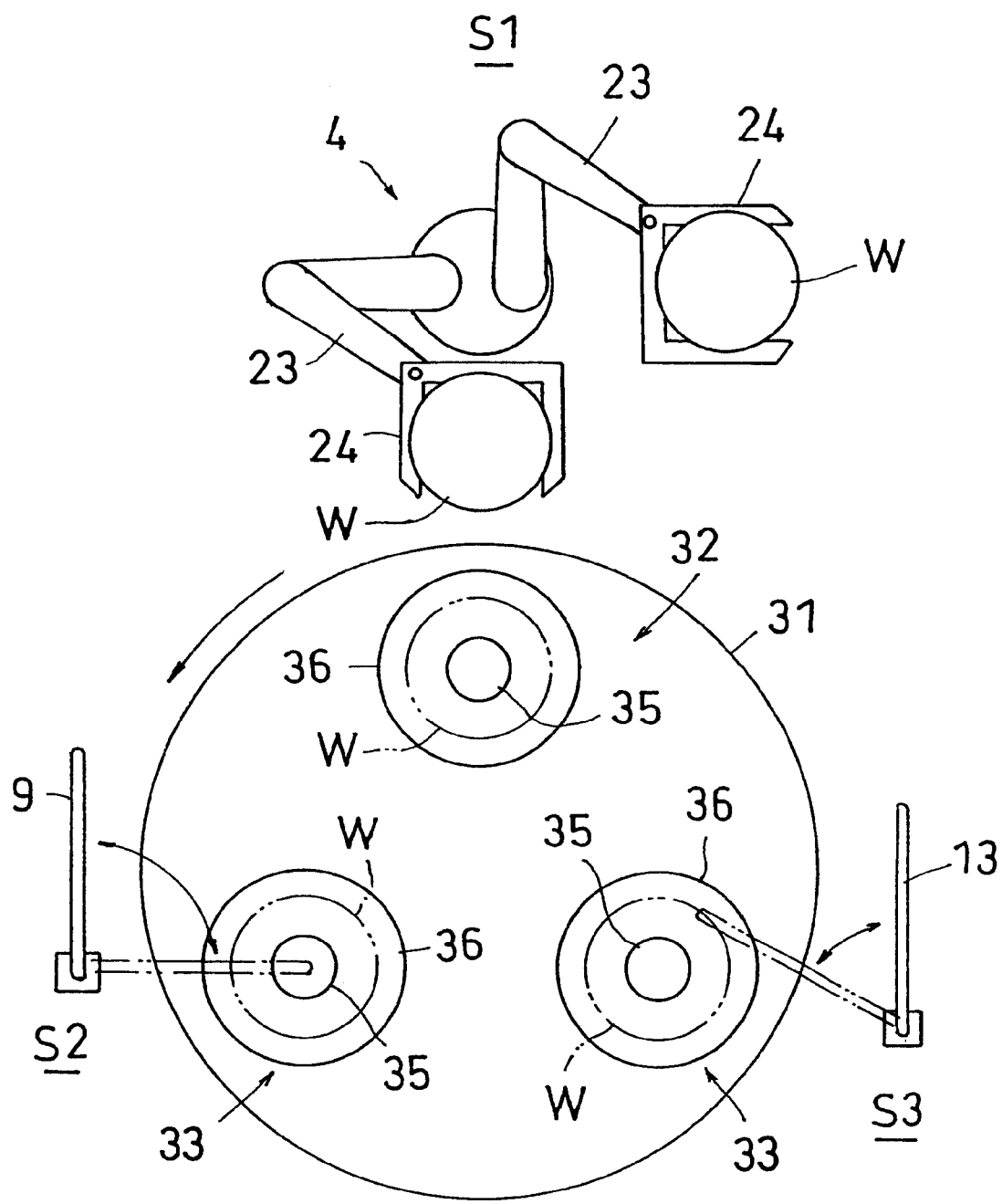
FIG. 8 is a plan view of a coating section in a fourth embodiment.

FIG. 8 is a plan view of a coating section in the fourth embodiment.

This embodiment includes a turntable 31 rotatable intermittently by approximately every 120 degrees. The turntable 31 has three substrate holders 32, 33 and 34 arranged equidistantly thereon. Each of the holders 32, 33 and 34 includes a spin chuck 35 and a scatter preventive cup 36. Processing stations S1, S2 and S3 are set around the turntable 31 to stopping positions of the substrate holders 32, 33 and 34. The processing station S1 has a transport mechanism 4 similar to that described in the first embodiment. The second processing station S2 has a resist supply nozzle 9 for supplying the photoresist solution. The third processing station S3 has a solvent supply nozzle 13 for edge rinsing. The combination of the processing stations and substrate holders in this embodiment corresponds to the processing unit of the present invention.

According to this embodiment, the transport mechanism 4 at the first processing station S1 first transfers a wafer W to be processed to the spin chuck 35 of the substrate holder 32. Once the spin chuck 35 holds the wafer W by suction, the turntable 31 makes an intermittent rotation to advance the substrate holder 32 to the second processing station S2.

At the second processing station S2, the resist supply nozzle 9 swings and supplies the photoresist solution to the wafer W in the substrate holder 32. Subsequently, the spin chuck 35 of the substrate holder 32 spins at a first spinning speed to cover the surface of wafer W with the photoresist solution (coverage process). After the coverage process, the turntable 31 makes a further intermittent rotation to advance the substrate holder 32 to the third processing station S3.

At the third processing station S3, the spin chuck 35 of the substrate holder 32 spins at high speed to make the photoresist solution into a film on the wafer W (leveling process). Further, the spin chuck 35 spins at a second spinning speed to dry the photoresist film on the wafer W (drying process). Subsequently, while spinning the wafer W, the solvent supply nozzle 13 supplies the solvent to the edges of wafer W, thereby washing the photoresist film away from the edges of wafer W (edge rinsing).

After the edge rinsing, the turntable 31 makes an intermittent rotation to return the substrate holder 32 to the first processing station S1. The transport mechanism 4 receives the processed wafer W from the spin chuck 35 of the substrate holder 32, and places a new wafer W to be processed on the spin chuck 35.

By repeating a similar procedure thereafter, the various processes are performed concurrently, i.e. the wafer loading and unloading process at the first processing station S1, the coverage process at the second processing station S2, and the leveling, drying and edge rinsing processes at the third processing station S3.

Since the resist supply nozzle 9 is used in common in this embodiment, all wafers W are processed with substantially the same coating conditions. Moreover, the throughput of the coating section may be improved by the concurrent wafer loading and unloading process, coverage process and leveling, drying and edge rinsing processes.

The first spinning speed and second spinning speed of the spin chucks 7 and 35 in time of the coverage, leveling, drying and other processes in the first and fourth embodiments, may be different, high and low speeds, or may be similar spinning speeds.

In the fourth embodiment described above, the wafer loading and unloading process is performed at the first processing station S1, the coverage process at the second processing station S2, and the leveling, drying and edge rinsing processes at the third processing station S3. However, the processes performed at the respective processing stations S1–S3 may be selected as desired. For example, the coverage and leveling processes may be performed at the second processing station S2, and the drying and edge rinsing processes at the third processing station S3. The number of processing stations is optional; two, four or more processing stations may be provided to perform the various film forming processes in separate time series.

In the first to fourth embodiments described hereinbefore, the drying and edge rinsing processes are assigned to one unit. As in the fifth to eighth embodiments to follow, the drying and edge rinsing processes may be performed in separate time series by two units, respectively.

Fifth Embodiment

In the first embodiment shown in FIGS. 3 and 4, for example, the first processing unit 5 is modified here to perform the coverage process, leveling process and drying process, and the second processing unit 6 is modified to perform the removing process. In this case, the first processing unit 5 corresponds to the coverage, leveling and drying unit of the present invention. The second processing unit 6 corresponds to the removing unit of the invention.

This modification is not limited to the first embodiment. The processing units 5 and 6 (or 26, 27 and 28) in the second or third embodiment, or the first, second and third processing stations S1, S2 and S3 in the fourth embodiment, may be modified as the coverage, leveling and drying unit, and as the removing unit of the present invention. Where the processing units 5 and 6 in first embodiment are applied to this embodiment, the first processing unit 5 may remove the photoresist solution from the edges of wafer W (edge rinsing) to prevent the photoresist solution from adhering to the supporting devices 24 of the transport mechanism 4, the second processing unit 6 performing only the back rinsing to wash away the photoresist solution having drifted round and adhered to the back surface of wafer W. This is the case also where the processing stations S1, S2 and S3 in the fourth embodiment are applied to this embodiment.

Sixth Embodiment

In the fifth embodiment, the first processing unit 5 in the first embodiment shown in FIGS. 3 and 4, for example, is applied as the coverage, leveling and drying unit of the present invention, and the second processing unit 6 as the removing unit of the invention. This embodiment uses the first processing unit 26 in the third embodiment shown in FIG. 7 as the coverage unit of the present invention, the second processing unit 27 as the leveling and drying unit of the invention, and the third processing unit 28 as the removing unit of the invention.

As in the fifth embodiment, the respective units in the first, second or fourth embodiment may be used as the coverage unit, the leveling and drying unit and the removing unit of the invention. The edge rinsing may be assigned to the coverage unit or the leveling and drying unit.

Seventh Embodiment

In the fifth and sixth embodiments, the leveling and drying processes are assigned to one processing unit. This embodiment uses the first processing unit 26 in the third embodiment shown in FIG. 7, for example, as the coverage and leveling unit of the present invention, the second processing unit 27 as the drying unit of the invention, and the third processing unit 28 as the removing unit of the invention.

As in the fifth and sixth embodiments, the respective units in the first, second or fourth embodiment may be used as the coverage and leveling unit, the drying unit and the removing unit of the invention. The edge rinsing may be assigned to the coverage and leveling unit or the drying unit.

Eighth Embodiment

In the fifth to seventh embodiments, two or three processing units (or processing stations) are used to perform the various processes. This embodiment provides a fourth processing unit, not shown, besides the first, second and third processing units 26, 27 and 28 in the third embodiment shown in FIG. 7, for example. The first processing unit 26 is used as the coverage unit of the present invention, the second processing unit 27 as the leveling unit of the invention, the third processing unit 28 as the drying unit of the invention, and the fourth unit as the removing unit of the invention.

As in the fifth to seventh embodiments, the respective units in the first, second or fourth embodiment may be used as the coverage unit, the drying unit, the drying unit and the removing unit of the invention. The edge rinsing may be assigned to the coverage unit, the leveling unit or the drying unit.

The present invention is not limited to the foregoing embodiments, but may be modified as follows:

(1) In the above embodiments, the photoresist solution is used as an example of coating solutions. The invention is applicable also where polyimide resin or SOG (spin on glass) is used for coating.

(2) In the above embodiments, the coverage, leveling and drying processes are carried out while spinning a wafer. The present invention is applicable also where such processes are carried out without spinning the wafer. For example, a slit nozzle may be driven to sweep over a wafer maintained still to cover the wafer surface with a coating solution. The wafer may be vibrated for leveling the coating solution. The wafer may be placed in a decompressed atmosphere. The coating film may be dried by using a blower or the like.

(3) The first to eighth embodiments described above exemplify the substrate processing apparatus performing a series of film forming processes that includes the removing process (edge rinsing and back rinsing) for removing unwanted parts of the photoresist solution from the wafer W. The substrate processing apparatus in the first to eighth embodiments may be modified to perform the series of film forming processes including the coverage process, leveling process and drying process, but not including the removing process.

(4) The spin chucks used in the first to eighth embodiments described above are the type that holds wafers by suction. Instead, a mechanical chuck may be used in part or all of the units (e.g. only in the rinsing (removing) unit) for mechanically holding a wafer (e.g. by engaging edges of the wafer).

Ninth Embodiment

Figure 9:
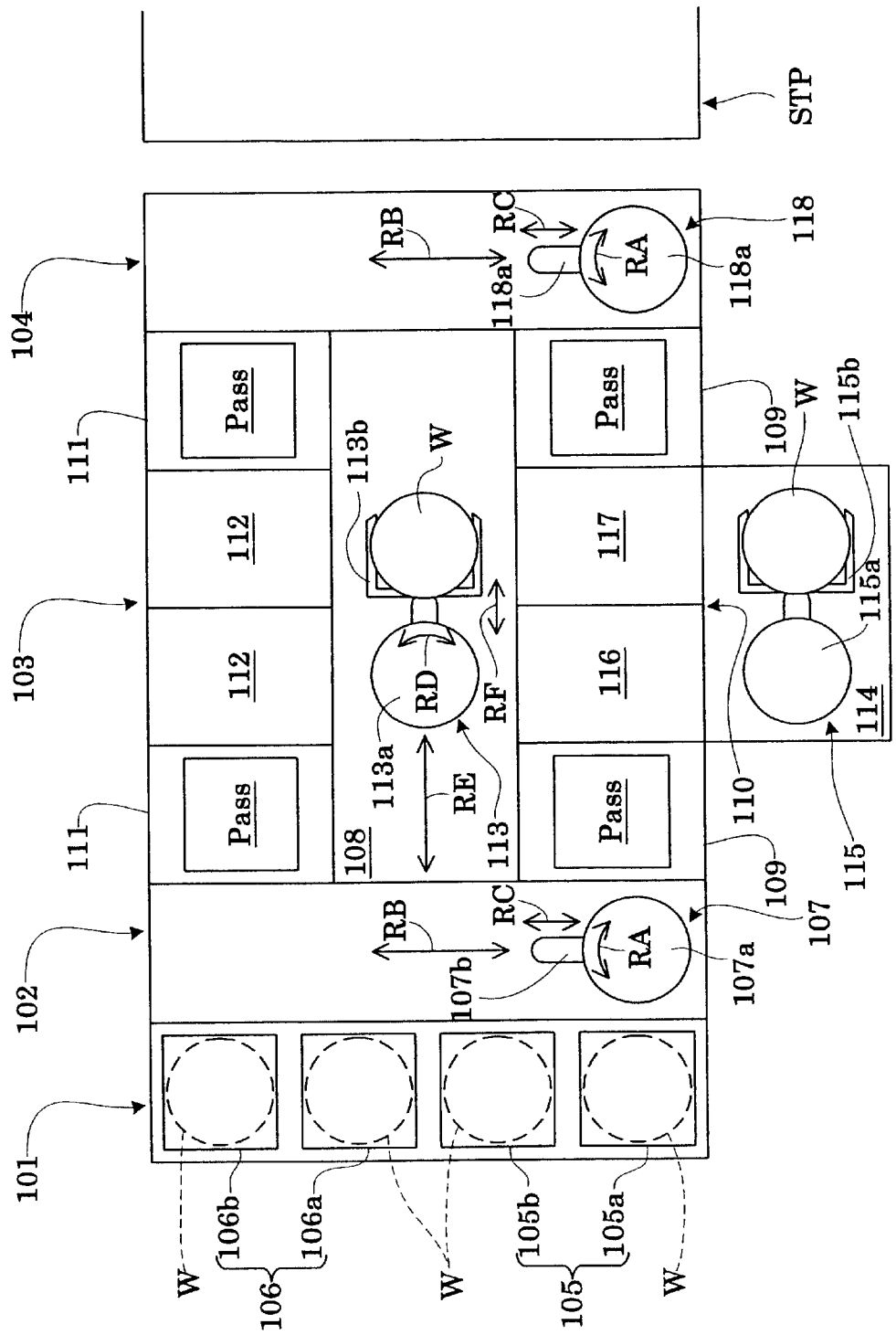
FIG. 9 is a plan block diagram of a substrate processing apparatus having a coating section in a ninth embodiment.
Figure 10:
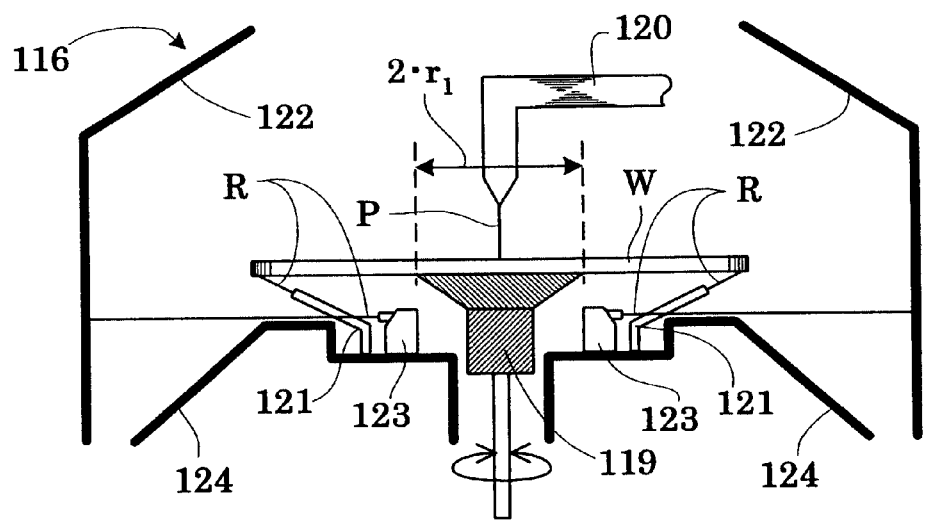
FIG. 10 is a schematic side view of a dedicated coating unit in the coating section in the ninth and tenth embodiments.
Figure 11:
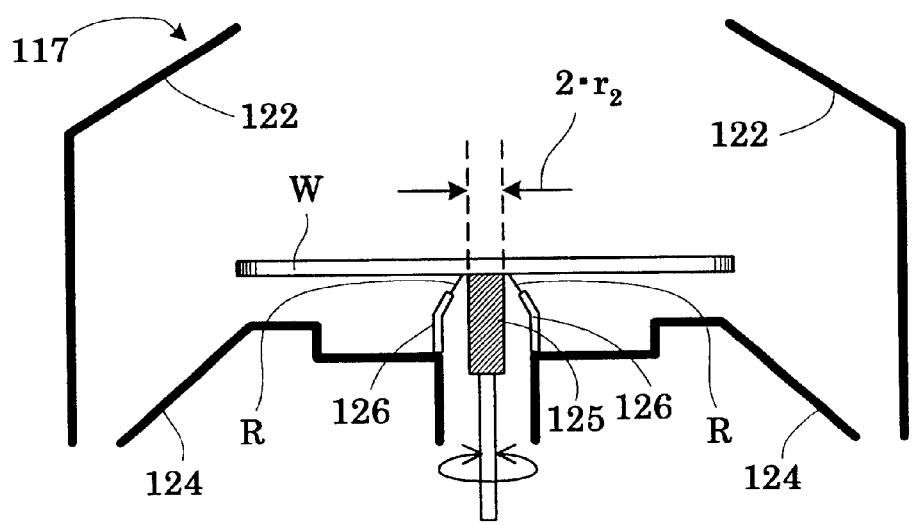
FIG. 11 is a schematic side view of a dedicated rinsing unit in the coating section in the ninth embodiment.

FIG. 9 is a plan block diagram of a substrate processing apparatus having a coating section in the ninth embodiment. FIG. 10 is a schematic side view of a dedicated coating unit in the coating section. FIG. 11 is a schematic side view of a dedicated rinsing unit in the coating section. In the ninth embodiment and in the tenth and eleventh embodiments to be described hereinafter, the substrate processing apparatus use a spin coater for performing a photolithographic process in which a coating solution is supplied adjacent the center of a substrate spinning at high speed, the coating solution spreading over the entire surface of the substrate under the centrifugal force of the substrate, thereby forming a film over the entire surface.

As shown in FIG. 9, the substrate processing apparatus in the ninth embodiment includes a cassette support table assembly 101, an indexer 102, a processing block 103 and an interface 104. The interface 104 connects the substrate processing apparatus and an apparatus provided separately. In the ninth embodiment, the interface 104 connects the substrate processing apparatus that performs a coating process and a developing process, with an exposing apparatus STP that exposes the substrates (e.g. a stepper for step exposure). The exposing apparatus STP corresponds to the external processing apparatus of the present invention.

As shown in FIG. 9, the cassette support table assembly 101 has an incoming section 105 for receiving cassettes (not shown) each storing a plurality of (e.g. 25) wafers W to be processed, and an outgoing section 106 for delivering cassettes storing processed wafers W. The incoming section 105 includes support tables 105a and 105b on which incoming cassettes are placed. The outgoing section 106 includes support tables 106a and 106b on which outgoing cassettes are placed.

The indexer 102 includes a transport mechanism 107 for transporting wafers W along a longitudinal direction of the indexer 102. The indexer's transport mechanism 107 has a base 107a rotatable in the directions of arrow RA and movable in the directions of arrow RB in FIG. 9, and an arm 107b extendible and contractible radially of rotation in the directions of arrow RC. This arm 107b transports each wafer W while supporting the wafer W at the back surface thereof. Further, the base 107a is vertically movable. The indexer's transport mechanism 107 having the above construction transports wafers W between the incoming and outgoing sections of the cassette support table assembly 101 and the processing block 103.

As shown in FIG. 9, the processing block 103 includes a processing transport passage 108, two heat-treating sections 109 for a coating process, a coating section 110, two heat-treating sections 111 for a developing process, a developing section 112, a processing transport mechanism 113, a coating transport passage 114 and a coating transport mechanism 115.

The two heat-treating sections 109 for the coating process and the coating section 110 are arranged along one side of the processing transport passage 108, while the two heat-treating sections 111 for the developing process and the developing section 112 are arranged along the other side of the processing transport passage 108. One of the two heat-treating sections 109 for the coating process is disposed adjacent the indexer 102, and the other heat-treating section 109 adjacent the interface 104. Similarly, one of the two heat-treating sections 111 for the developing process is disposed adjacent the indexer 102, and the other heat-treating section 111 adjacent the interface 104.

The processing transport mechanism 113, as does the indexer's transport mechanism 107, has a base 113a rotatable in the directions of arrow RD and movable in the directions of arrow RE in FIG. 9, and an arm 113b extendible and contractible radially of rotation in the directions of arrow RF. This arm 113b transports each wafer W while supporting the wafer W at the edges thereof. Further, the base 113a is vertically movable. The processing transport mechanism 113 having the above construction transports wafers W along the processing transport passage 108 between the two heat-treating sections 109 for the coating process, the coating section 110, the two heat-treating sections 111 for the developing process and the developing section 112. The processing transport mechanism 113 corresponds to the second transport device of the present invention.

The coating transport mechanism 115 transports wafers W along the coating transport passage 114 between a dedicated coating unit 116 and a dedicated rinsing unit 117 in the coating section 110. The coating transport mechanism 115 has the same construction as the processing transport mechanism 113, and will not particularly be described. The transport mechanism 115 corresponds to the first transport device of the present invention. The dedicated coating unit 116 corresponds to the first processing section of the invention. The dedicated rinsing unit 117 corresponds to the second processing section of the invention.

The interface 104 includes a transport mechanism 118 for transporting wafers W along a longitudinal direction of the interface 104. The interface's transport mechanism 118 transports the wafers W between the processing block 103 and exposing apparatus STP. The interface's transport mechanism 118 has the same construction as the indexer's transport mechanism 107, and will not particularly be described.

The heat-treating section 109 for the coating process disposed adjacent the indexer 102 has a "Pass" for receiving a wafer W to be transferred between the heat-treating section 109 and indexer 102. The heat-treating section 109 for the coating process disposed adjacent the interface 104 has a "Pass" for receiving a wafer W to be transferred between the heat-treating section 109 and interface 104. Each "Pass", an HP (not shown) and a CP (not shown) are vertically arranged, in a stated order from top to bottom, the HP being used for baking treatment to heat each wafer W, and the CP for cooling the heated wafer W and maintaining the wafer W at room temperature. Each of the heat-treating sections 111 for the developing process adjacent the indexer 102 and interface 104 has a "Pass", a CP and a HP vertically arranged in a stated order from top to bottom. Besides the above HP and CP, a processor may be provided for performing an adhesion process to improve contact between wafer W and photoresist film.

Next, a specific construction of the dedicated coating unit 116 will be described with reference to the side view of FIG. 10. As shown in FIG. 10, the dedicated coating unit 116 includes a spin chuck 119 for supporting a central portion of a wafer W by suction, and maintaining the wafer W in horizontal posture, a coating nozzle 120 for discharging and supplying a photoresist solution P to the surface of wafer W in horizontal posture, edge rinse nozzles 121 for discharging and supplying a rinse solution R as a cleaning solution to edges of the wafer W, a scatter preventive cup 122 for preventing scattering of the photoresist solution P and rinse solution R supplied, cup rinse nozzles 123 for cleaning the scatter preventive cup 122, and a flow straightener disk 124 for draining the photoresist solution P and rinse solution R supplied. The spin chuck 119 corresponds to the first substrate holding device (and the vacuum chuck) of the present invention. The coating nozzle 120 corresponds to the coating solution supplying device of the invention. The edge rinse nozzles 121 correspond to the edge cleaning device of the invention. It is to be noted that there are two ways for the edge cleaning process to clean the edges of wafer W, which are a removing of particles or stains from edges on the front or upper surface of wafer W and a removing of particles or stains from edges on the back surface of wafer W.

The spin chuck 119 has a function to hold a wafer W by suction-supporting the wafer W, and a function to spin the wafer W in a horizontal plane. The dedicated coating unit 116 has a function to coat the surface of wafer W.

Next, a specific construction of the dedicated rinsing unit 117 will be described with reference to the side view of FIG. 11. The dedicated rinsing unit 117 includes a scatter preventive cup 122 and a flow straightener disk 124 similar to those of the dedicated coating unit 116. The dedicated rinsing unit 117 further includes a spin chuck 125 and back rinse nozzles 126 for supplying the rinse solution R to the back surface of wafer W held in horizontal posture. The spin chuck 125 corresponds to the second substrate holding device (and the vacuum chuck) of the present invention. The back rinse nozzles 126 correspond to the cleaning solution supplying device of the invention.

The spin chuck 125 of the dedicated rinsing unit 117 spins the wafer W at a lower speed than the spin chuck 119 of the dedicated coating unit 116. The dedicated rinsing unit 117 has a function to remove the photoresist solution P from the back surface of wafer W, marks made on the wafer W when the latter is held by the spin chuck 119 of dedicated coating unit 116, and stains or particles from the wafer W.

The spin chuck 119 of the dedicated coating unit 116 has a diameter $2 \cdot r_1$. The spin chuck 125 of the dedicated rinsing unit 117 has a diameter $2 \cdot r_2$ smaller than the diameter $2 \cdot r_1$ of the spin chuck 119 of the dedicated coating unit 116. As a result, an area $S_2$ ($=\pi \times r_2^2$) of wafer W suction-supported by the spin chuck 125 of the dedicated rinsing unit 117 is smaller than an area $S1$ ($=\pi \times r_1^2$) suction-supported by the spin chuck 119 of the dedicated coating unit 116. The area $S_1$ suction-supported by the spin chuck 119 corresponds to the first support area of the present invention. The area $S_2$ suction-supported by the spin chuck 125 corresponds to the second support area of the invention.

Since the area $S_2$ suction-supported by the spin chuck 125 of the dedicated rinsing unit 117 is smaller than the area $S_1$ suction-supported by the spin chuck 119 of the dedicated coating unit 116, the back rinse nozzles 126 of the dedicated rinsing unit 117 can remove the photoresist solution P from part ($S_1$–$S_2$) of the area suction-supported by the spin chuck 119 of the dedicated coating unit 116, though not from the entire area suction-supported by the spin chuck 119.

The diameter $2 \cdot r_2$ of the spin chuck 125 is not limited to a particular size. However, the diameter $2 \cdot r_2$ should preferably be small in order to remove the photoresist solution P from an increased area, as long as the wafer holding and spinning capabilities of the spin chuck 125 are retained. In the ninth embodiment, as noted above, the spin chuck 125 spins the wafer W at a lower speed than the spin chuck 119. Thus, no problem will arise from the diameter $2 \cdot r_2$ of the spin chuck 125 of the dedicated rinsing unit 117 being smaller than the diameter $2 \cdot r_1$ of the spin chuck 119 of the dedicated coating unit 116. The diameter $2 \cdot r_2$ may be further reduced where the back rinse nozzles 126 are moved relative to the wafer W instead of spinning the wafer W in time of back rinsing.

Figure 12:
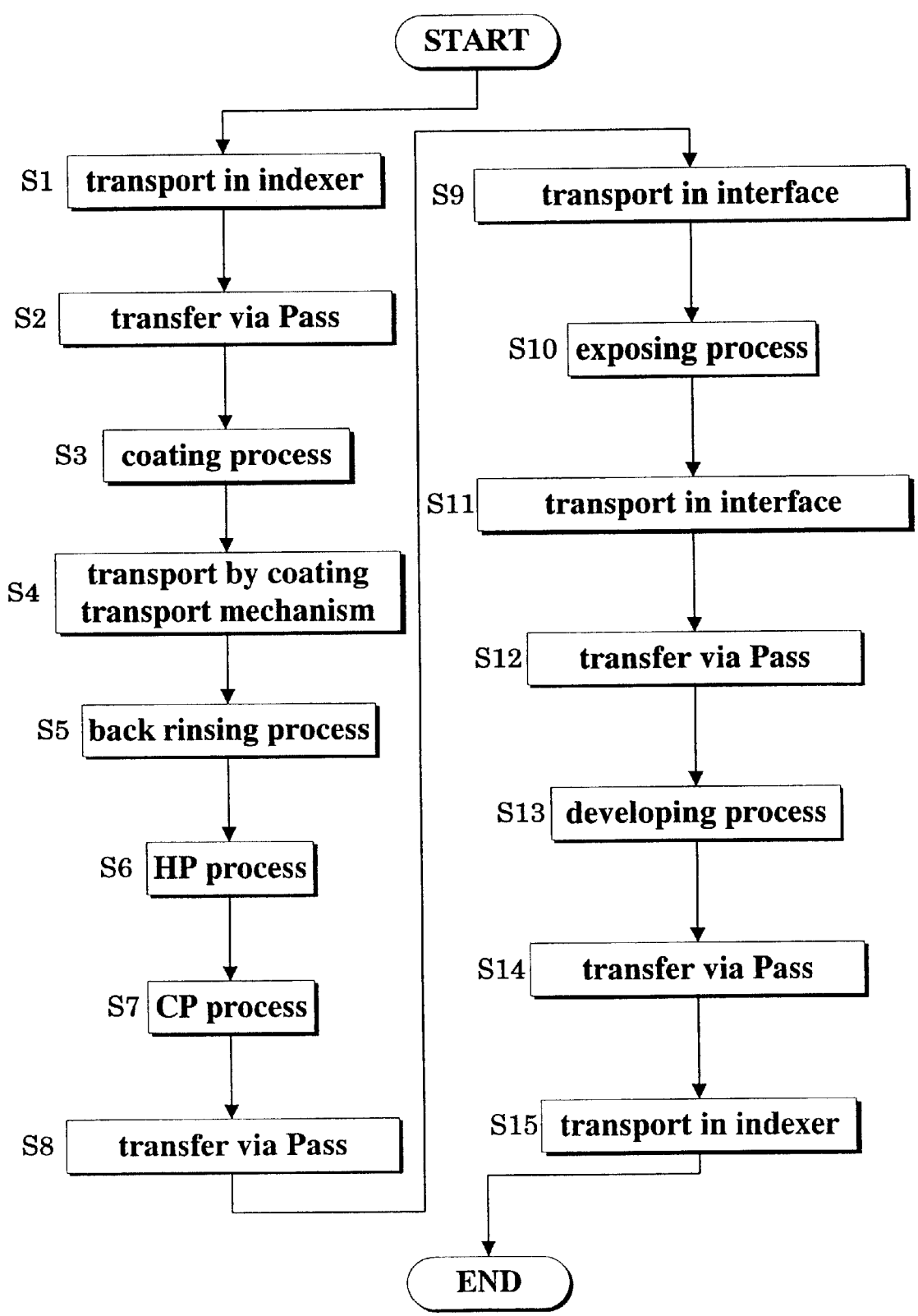
FIG. 12 is a flow chart of a series of substrate processes.

Next, a series of substrate processes will be described with reference to the flow chart of FIG. 12.

(Step S1) Transport in Indexer

A cassette (not shown) storing a plurality of wafers W to be processed is introduced to and placed on the support table 105a or 105b of the incoming section 105 of cassette support table assembly 101. To take one wafer W out of the cassette, the base 107a of the indexer's transport mechanism 107 is moved to a position adjacent the cassette, and the arm 107b is extended in the direction of arrow RC. The extended arm 107b holds one wafer W in the cassette by supporting the back surface thereof. Subsequently, the arm 107b holding the wafer W is retracted in the direction of arrow RC.

(Step S2) Transfer via "Pass"

To deliver the wafer W to the heat-treating section 109 for the coating process disposed adjacent the indexer 102, the wafer W is placed on the "Pass" of the heat-treating section 109. Specifically, the base 107a of the indexer's transport mechanism 107 is moved along the indexer 102 to a position adjacent the "Pass". Then, the arm 108e is extended to place the wafer W on the "Pass".

The wafer W placed on the "Pass" is lowered by the indexer's transport mechanism 107 or the processing transport mechanism 113, as necessary, to the position of the HP or CP disposed under the "Pass" to receive the HP (baking) process for heating the wafer W or the CP process for cooling the heated wafer W and maintaining it at room temperature. In the ninth embodiment, no HP or CP process is carried out. The processing transport mechanism 113 transports the wafer W to the dedicated coating unit 116 in the coating section 110. Before the coating process, an adhesion process may be carried out to improve contact between the wafer W and photoresist film.

(Step S3) Coating Process

To transport the wafer W placed on the "Pass" to the dedicated coating unit 116, the base 113a of the processing transport mechanism 113 is moved to a position adjacent the "Pass", and the arm 113b is extended in the direction of arrow RF. The extended arm 113b holds the wafer W by supporting the edges thereof. Subsequently, the arm 113b holding the wafer W is retracted in the direction of arrow RF. Then, the base 113a of the processing transport mechanism 113 is moved along the processing transport passage 108 to a position adjacent the dedicated coating unit 116. The arm 113b is lowered along with the base 113a to place the wafer W on the spin chuck 119 of the dedicated coating unit 116.

The spin chuck 119 suction-supports a central portion of wafer W and holds the wafer W in horizontal posture. The arm 113b releases the wafer W held in horizontal posture. Then, the wafer W is spun in a horizontal plane. With the wafer W spinning, the coating nozzle 120 discharges and supplies the photoresist solution P adjacent the center on the surface of wafer W. Then, the centrifugal force of wafer W spreads the photoresist solution P from the center over the entire surface of wafer W. To remove stains or particles adhering to the edges of wafer W, the edge rinse nozzles 121 discharge and supply the rinse solution R to the edges of wafer W. To clean the scatter preventive cup 122, the cup rinse nozzles 123 discharge the rinse solution R.

(Step S4) Transport by Coating Transport Mechanism

After the photoresist solution P forms a photoresist film on the surface of wafer W and particles are removed from the edges of wafer W, the spin chuck 119 stops spinning the wafer W in the horizontal plane. On the other hand, the base 115a of the coating transport mechanism 115 is moved to a position adjacent the dedicated coating unit 116, and the arm 115b is lowered along with the base 115a. The lowered arm 115b holds the wafer W by supporting the edges of wafer W lying still on the spin chuck 119 of the dedicated coating unit 116. Subsequently, the spin chuck 119 releases the wafer W held by the arm 115b. The arm 115b is raised along with the base 115a, and the base 115a of the coating transport mechanism 115 is moved along the coating transport passage 114 to a position adjacent the dedicated rinsing unit 117. The arm 115b is lowered along with the base 115a to place the wafer W on the spin chuck 125 of the dedicated rinsing unit 117.

(Step S5) Back Rinsing Process

The spin chuck 125 suction-supports the central portion of wafer W and holds the wafer W in horizontal posture. The arm 115b releases the wafer W held in horizontal posture. Then, the wafer W is spun in a horizontal plane. The wafer W is spun at a lower speed in step S5 than in step S4. With the wafer W spinning, the back rinse nozzles 126 discharge and supply the rinse solution R to the back surface of wafer W. Then, stains or particles adhering to the back surface of wafer W are removed.

(Step S6) HP Process

After the stains or particles are removed from the back surface of wafer W, the spin chuck 125 stops spinning the wafer W in the horizontal plane. On the other hand, the base 113a of the processing transport mechanism 113 is moved to a position adjacent the dedicated rinsing unit 117, and the arm 113b is lowered along with the base 113a. The lowered arm 113b holds the wafer W by supporting the edges of wafer W lying still on the spin chuck 125 of the dedicated rinsing unit 117. Subsequently, the spin chuck 125 releases the wafer W held by the arm 113b. The arm 113b is raised along with the base 113a, and the base 113a of the processing transport mechanism 113 is moved along the processing transport passage 108 a position adjacent the HP in the heat-treating section 109 for the coating process disposed adjacent the interface 104. The arm 113b is extended to place the wafer W on the HP in the heat-treating section 109. The HP (baking) process is performed to heat the wafer W placed on the HP.

(Step S7) CP Process

After the HP process, the processing transport mechanism 113 lowers the wafer W from the HP to the CP disposed under the HP. The CP process is performed to cool the wafer W heated in the HP process to maintain the wafer W at room temperature.

(Step S8) Transfer via "Pass"

After the CP process, the wafer W is moved to the "Pass" disposed over the CP to transfer the wafer W to the interface 104. Specifically, the base 113a of the processing transport mechanism 113 is moved to the position adjacent the CP, and the arm 113b is extended. The extended arm 113b holds the wafer W by supporting the edges of wafer W. Subsequently, the arm 113b holding the wafer W is retracted. The arm 113b is raised along with the base 113a to a position adjacent the "Pass", and the arm 113b is extended. The wafer W is placed on the "Pass".

In the ninth embodiment, the wafer W is placed on the "Pass" after the CP process, and transferred between the heat-treating section 109 for the coating process and the interface 104. Alternatively, the wafer W may be transferred, through the CP, between the heat-treating section 109 for the coating process and the interface 104.

(Step S9) Transport in Interface

The interface's transport mechanism 118 transports the wafer W from the "Pass" through the interface 104 to the exposing apparatus STP which is an external processing apparatus. For this purpose, the base 118a of the interface's transport mechanism 118 is moved to a position adjacent the "Pass", and the arm 118b is extended. The extended arm 118b holds the wafer W by supporting the back surface thereof. Subsequently, the arm 118b holding the wafer W is retracted. The base 118a is moved along the interface 104 to an inlet of the exposing apparatus STP.

(Step S10) Exposing Process

The arm 118b is extended to load the wafer W into the exposing apparatus STP. An exposing process is performed on the wafer W loaded into the exposing apparatus STP.

(Step S11) Transport in Interface

After the exposing process, the base 118a of the interface's transport mechanism 118 is moved to an outlet of the exposing apparatus STP, and the arm 118b is extended to unload the wafer W from the exposing apparatus STP. The extended arm 118b holds the wafer W by supporting the back surface thereof. Subsequently, the arm 118b holding the wafer W is retracted.

(Step S12) Transfer via "Pass"

To transfer the wafer W to the heat-treating section 111 for the developing process disposed adjacent the interface 104, the wafer W is placed on the "Pass" of the heat-treating section 111. Specifically, the base 118a of the interface's transport mechanism 118 is moved along the interface 104 to a position adjacent the "Pass". Then, the arm 118e is extended to place the wafer W on the "Pass". Before the developing process to be described hereinafter, the wafer W may be transported to a position adjacent the HP or CP arranged with the "Pass", as necessary, to perform the HP or CP process.

(Step S13) Developing Process

To transport the wafer W placed on the "Pass" to the developing section 112, the base 113a of the processing transport mechanism 113 is moved to a position adjacent the "Pass", and the arm 113b is extended. The extended arm 113b holds the wafer W by supporting the edges thereof. Subsequently, the arm 113b holding the wafer W is retracted. Then, the base 113a of the processing transport mechanism 113 is moved along the processing transport passage 108 to a position adjacent the developing section 112. The arm 113b is lowered along with the base 113a to place the wafer W on a spin chuck (not shown) of the developing section 112.

As in the coating process in step S3, the spin chuck suction-supports the wafer W in horizontal posture. A developing process is carried out by supplying a developer to the surface of wafer W while spinning the wafer W in a horizontal plane.

(Step S14) Transfer via "Pass"

After the developing process, the wafer W is placed on the "Pass" of the heat-treating section 111 disposed adjacent the indexer 102 to transfer the wafer W to the indexer 102. Specifically, the base 113a of the processing transport mechanism 113 is moved along the processing transport passage 108 to a position adjacent the "Pass". Then, the arm 113e is extended to place the wafer W on the "Pass".

(Step S15) Transport in Indexer

To transport the wafer W from the "Pass" to the support table 106a or 106b in the outgoing section 106 of the cassette support table assembly 101, the base 107a of the indexer's transport mechanism 107 is moved to a position adjacent the "Pass", and the arm 107b is extended. The extended arm 107b holds the wafer W by supporting the back surface thereof. Subsequently, the arm 107b holding the wafer W is retracted. The base 107a of the indexer's transport mechanism 107 is moved along the indexer 102 to a position adjacent a cassette, and the arm 107b is extended. After storing the processed wafer W in the cassette, the arm 107b is retracted. When a predetermined number of processed wafers W are stored in the cassette, the cassette is moved away from the outgoing section 106 to complete a series of substrate processes.

The substrate processing apparatus in the ninth embodiment having the above construction performs the following functions. In step S3, the coating process is carried out to coat the surface of wafer W by supplying the photoresist solution P, which is a coating solution, from the coating nozzle 120 to the surface of wafer W. In step S5, the back rinsing process is carried out to remove stains or particles from the back surface of wafer W by supplying the rinse solution R, which is a cleaning solution, from the back rinse nozzles 126 to the back surface of wafer W. The coating process is assigned to the dedicated coating unit 119, while the back rinsing process is assigned to the dedicated rinsing unit 117. Further, the dedicated coating unit 116 includes the spin chuck 119 for holding the wafer W in horizontal posture by suction-supporting a central portion of the back surface of wafer W. Similarly, the dedicated rinsing unit 117 includes the spin chuck 125 for holding the wafer W in horizontal posture by suction-supporting the central portion of the back surface of wafer W. The spin chuck 125 supports the area $S_2$ which is different from the area $S_1$ supported by the spin chuck 119. The rinse solution R is supplied to clean the part ($S_1$–$S_2$) of the area $S_1$ supported by the spin chuck 119, on the back surface of wafer W now supported by the spin chuck 125. This improves the capability of removing stains from the back surface of wafer W. As a result, the wafer W is coated with high precision.

For the spin chuck 125 to support the area $S_2$ different from the area $S_1$ supported by the spin chuck 119, in the ninth embodiment, the spin chuck 125 of the dedicated rinsing unit 117 has a diameter $2 \cdot r_2$ smaller than the diameter $2 \cdot r_1$ of the spin chuck 119 of the dedicated coating unit 116.

As a result, the area $S_2$ ($=\pi \times r_2^2$) of wafer W suction-supported by the spin chuck 125 is smaller than the area $S_1$ ($=\pi \times r_1^2$) suction-supported by the spin chuck 119 of the dedicated coating unit 116. Since the area $S_2$ suction-supported by the spin chuck 125 of the dedicated rinsing unit 117 is smaller than the area $S_1$ suction-supported by the spin chuck 119 of the dedicated coating unit 116, the back rinse nozzles 126 of the dedicated rinsing unit 117 can remove the photoresist solution P from the part ($S_1$–$S_2$) of the area suction-supported by the spin chuck 119 of the dedicated coating unit 116, though not from the entire area suction-supported by the spin chuck 119.

In the ninth embodiment, the dedicated coating unit 116 includes the edge rinse nozzles 121 for removing stains or particles adhering to the edge of wafer W by supplying the rinse solution R to the edges of wafer W. The coating transport mechanism 115 supports the edges of wafer W and transports the wafer W between the dedicated coating unit 116 and dedicated rinsing unit 117. In step S3, the dedicated coating unit 116 carries out both the coating process for coating the surface of wafer W, and the edge rinsing process for removing stains from the edges of wafer W. Thereafter, in step S4, the coating transport mechanism 115 transports the wafer W from the dedicated coating unit 116 to the dedicated rinsing unit 117. In step S5, the dedicated rinsing unit 117 carries out the back rinsing process for removing stains from the back surface of wafer W.

In step S3, the dedicated coating unit 116 first carries out the coating process for coating the surface of wafer W, and the edge rinsing process for removing stains from the edges of wafer W. Thus, no stains are present on the edges of wafer W when, in step S4, the coating transport mechanism 115 supports the edges of wafer W and transports the wafer W to the dedicated rinsing unit 117. Where the wafer W is transported to the dedicated rinsing unit 117 without carrying out the edge rinsing process in the dedicated coating unit 116 to remove the stains from the edges of wafer W, the stains adhering to the edges of wafer W will not only adhere to the coating transport mechanism 115, but also affect, by staining, even the dedicated rinsing unit 117 through the coating transport mechanism 115. The ninth embodiment effectively reduces contamination of the coating transport mechanism 115 and the adverse effect on the dedicated rinsing unit 117.

The substrate processing apparatus employing the coating section 110 having the dedicated coating unit 116 and dedicated rinsing unit 117 includes the processing transport mechanism 113 for transporting the wafer W between the plurality of processing sections (i.e. the heat-treating sections 109 and 111, coating section 110 and developing station 112) that perform substrate processes, respectively, including the dedicated coating unit 116 and dedicated rinsing unit 117. This processing apparatus is capable of efficiently performing the series of substrate processes including the coating process and the cleaning process for removing stains or particles adhering to the back surface of wafer W.

The ninth embodiment includes the interface 104 for relaying the transfer of wafer W between the above processing sections and the exposing apparatus STP connected to the substrate processing apparatus and corresponding to the external processing apparatus of the present invention. In step S9, the wafer W coated with high precision in the coating section 110 may be transported through the interface 104 to the exposing apparatus STP. Since the wafer W is coated with high precision, the substrate processing may be performed efficiently with the exposing apparatus STP. Defective exposure due to the photoresist solution P adhering to the back surface of wafer W may be reduced, compared with the prior art.

Tenth Embodiment

The tenth embodiment of the present invention will be described next. Like reference numerals are used to identify like parts which are the same as in the ninth embodiment and will not be described again. The substrate processing apparatus in the tenth embodiment is the same as in the ninth embodiment shown in the plan block diagram of FIG. 9. The dedicated coating unit 116 in the tenth embodiment is the same as the dedicated coating unit 116 in the ninth embodiment shown in the side view of FIG. 10. The spin chuck 119 of the dedicated coating unit 116 in the ninth embodiment corresponds to the first substrate holding device.

Figure 13:
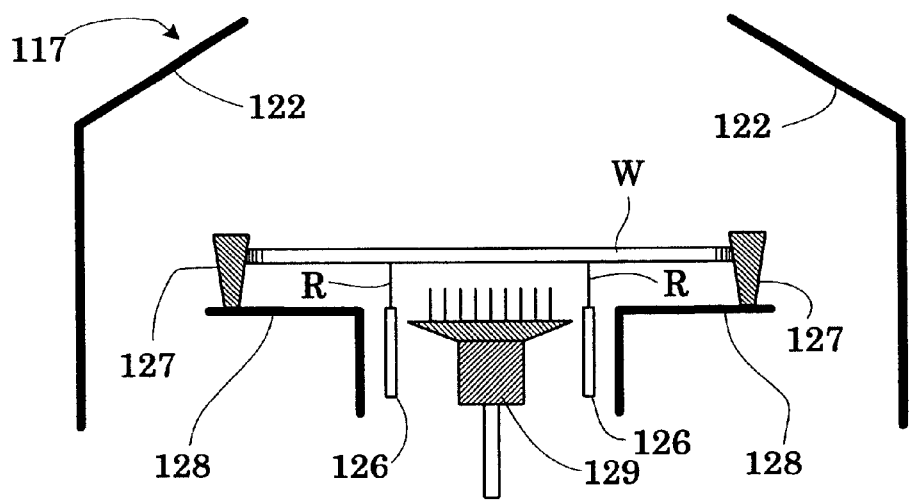
FIG. 13 is a schematic side view of a dedicated rinsing unit in the coating section in the tenth embodiment.

A specific construction of the dedicated rinsing unit 117 will be described with reference to the side view of FIG. 13. The dedicated rinsing unit 117 includes a scatter preventive cup 122 and back rinse nozzles 126 as in the ninth embodiment. The rinsing unit 117 further includes a plurality of mechanical chucks 127 for holding a wafer W in horizontal posture by supporting the edges thereof, a spin table 128 with the mechanical chucks 127 erected thereon for spinning the wafer W supported by the mechanical chucks 127 in a horizontal plane, and a brush 129 for directly contacting and scrubbing the back surface of wafer W to remove the photoresist solution P adhering to the back surface. Two back rinse nozzles 126 are arranged around the brush 129. The mechanical chucks 127 correspond to the second substrate holding device of the present invention.

In the tenth embodiment, as distinct from the ninth embodiment, while the spin chuck 119 of the dedicated coating unit 116 supports the central portion of the back surface of wafer W by suction, the mechanical chucks 127 of the dedicated rinsing unit 117 support the edges of wafer W. Thus, the areas (i.e. the edges) supported by the mechanical chucks 127 of the dedicated rinsing unit 117 are different from the area S1 suction-supported by the spin chuck 119 of the dedicated coating unit 116. The back rinse nozzles 126 and brush 129 of the dedicated rinsing unit 117 can remove stains from the entire area S1 on the back surface of wafer W suction-supported by the spin chuck 119.

A series of substrate processes is the same as in the ninth embodiment, and will not be described again.

Eleventh Embodiment

The eleventh embodiment of the present invention will be described next. Like reference numerals are used to identify like parts which are the same as in the ninth and tenth embodiments and will not be described again. The dedicated rinsing unit 117 in the tenth embodiment is used here also as the dedicated coating unit 116. The coating transport mechanism 115 is replaced by a reversing mechanism 130 for turning over the wafer W and placing the wafer W back in position. The other aspects of the substrate processing apparatus in the eleventh embodiment is the same as in the ninth and tenth embodiments shown in the plan block diagram of FIG. 9. The reversing mechanism 130 corresponds to the reversing device of the present invention.

Figure 14:
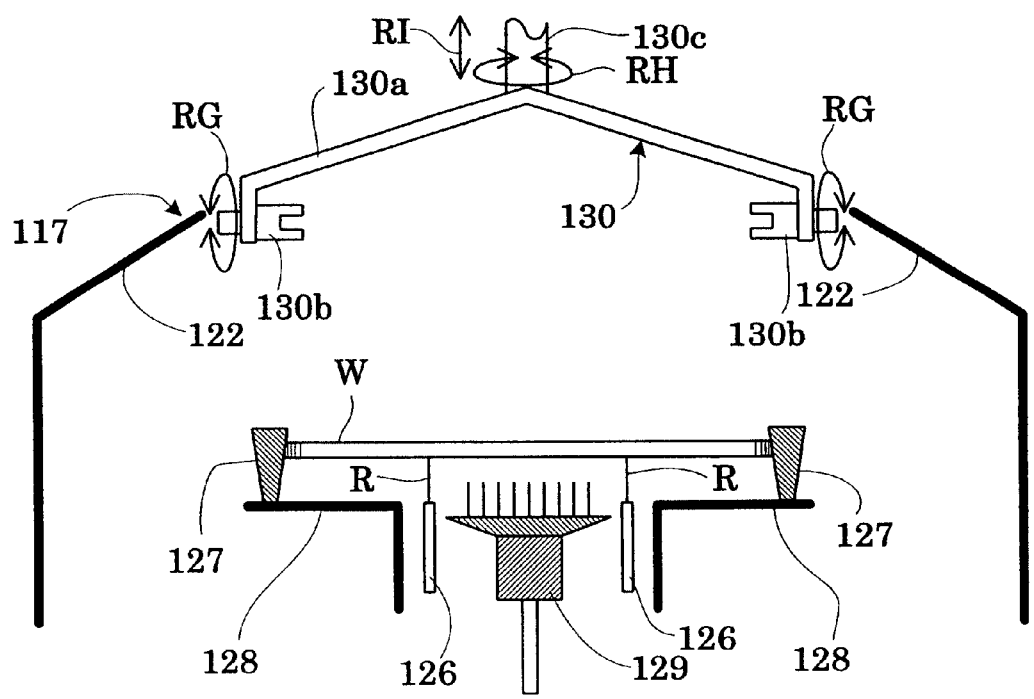
FIG. 14 is a side view of a dedicated rinsing unit and a reversing mechanism in an eleventh embodiment.

A specific construction of the dedicated rinsing unit 117 and reversing mechanism 130 will be described next with reference to the side view of FIG. 14. The dedicated rinsing unit 117 includes a scatter preventive cup 122, back rinse nozzles 126, a plurality of mechanical chucks 127, a spin table 128 and a brush 129 as in the tenth embodiment. The reversing mechanism 130 is disposed above the dedicated rinsing unit 117. In addition, the eleventh embodiment includes a coating nozzle, not shown, for coating the wafer W.

The reversing mechanism 130 includes an arm 130a, two holding shafts 130b for holding the edges of wafer W and turning the wafer W in a direction of arrows RG about the axis of the shafts 130b, and an arm support shaft 130c for rotating the arm 130a in a direction of arrow RH about the axis of the shaft 130c and vertically moving the arm 130a in directions of arrow RI. One of the two holding shafts 130b is disposed at one end of the arm 130a, while the other holding shaft 130b is disposed at the other end of the arm 130a. The holding shafts 130b are rotatable simultaneously in the same direction about the axis thereof.

Figure 15:
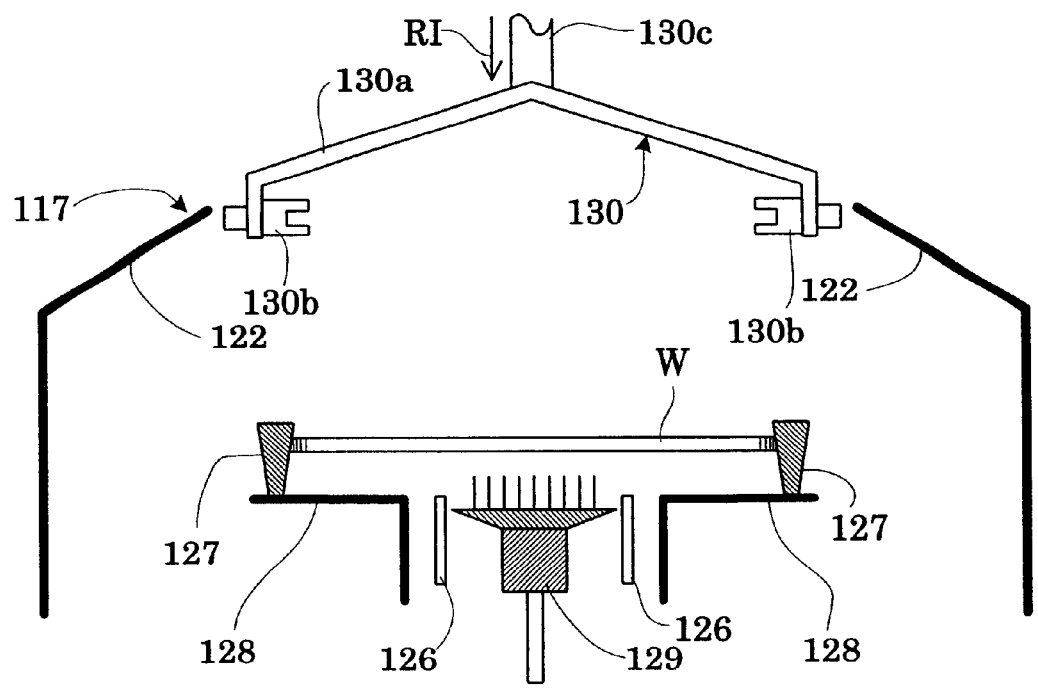
FIG. 15 is a side view illustrating a way in which a substrate is turned over for a back rinsing process immediately following a coating process.

How the wafer W is turned over and placed back in position for receiving the back rinsing process immediately after the coating process will be described with reference to FIGS. 15 through 18. After the coating process in step S3 described in the ninth embodiment, as shown in FIG. 15, the arm support shaft 130c of the reversing mechanism 130 is lowered in the direction of arrow RI to lower the arm 130a and holding shafts 130b. At this time, the holding shafts 130b are prevented from colliding with the mechanical chucks 127. The holding shafts 130b are moved right and left to grip the edges of wafer W, and then the mechanical chucks 127 are operated to release the wafer W.

Figure 16:
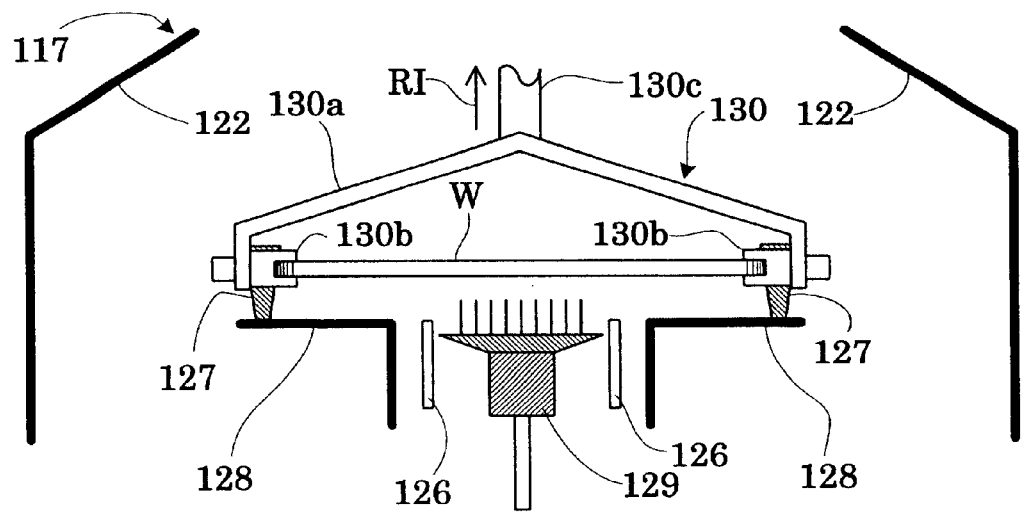
FIG. 16 is a side view illustrating the way in which the substrate is turned over for the back rinsing process immediately following the coating process.

After the release, as shown in FIG. 16, the arm support shaft 130c of the reversing mechanism 130 is raised in the direction of arrow RI. The arm 130a and holding shafts 130b are thereby raised along with the wafer W with the edges thereof gripped by the holding shafts 130b.

Figure 17:
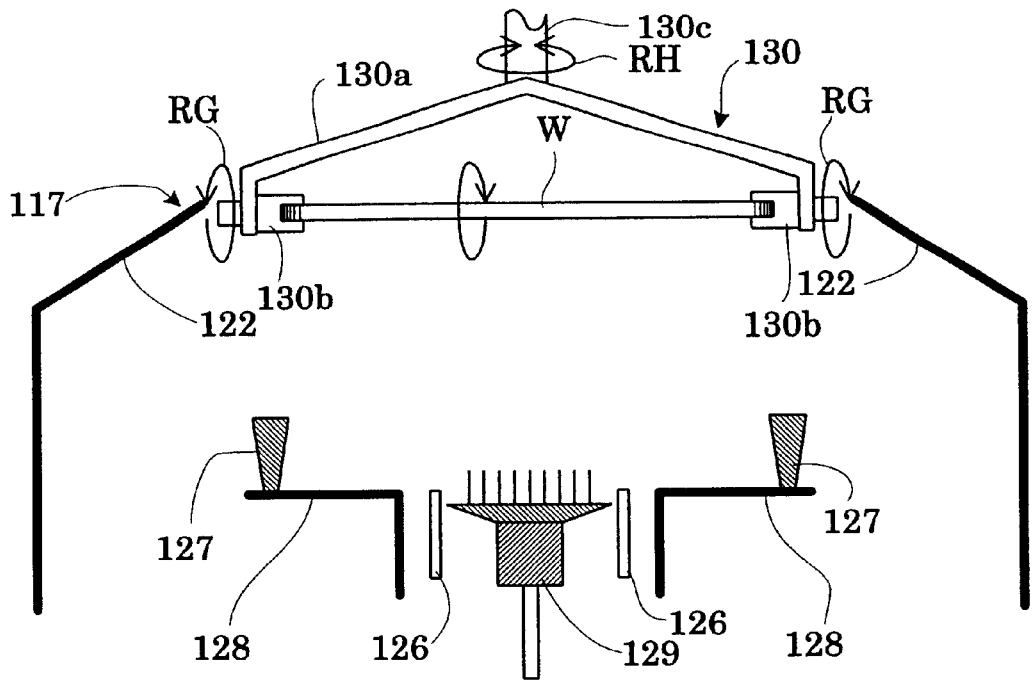
FIG. 17 is a side view illustrating the way in which the substrate is turned over for the back rinsing process immediately following the coating process.

After the wafer W is raised to a predetermined height, as shown in FIG. 17, the two holding shafts 130b are simultaneously rotated 180 degrees in the direction of arrow RG, and the arm support shaft 130c is rotated a predetermined angle in the direction of arrow RH. The 180-degree rotation of the holding shafts 130b turns over the wafer W.

Figure 18:
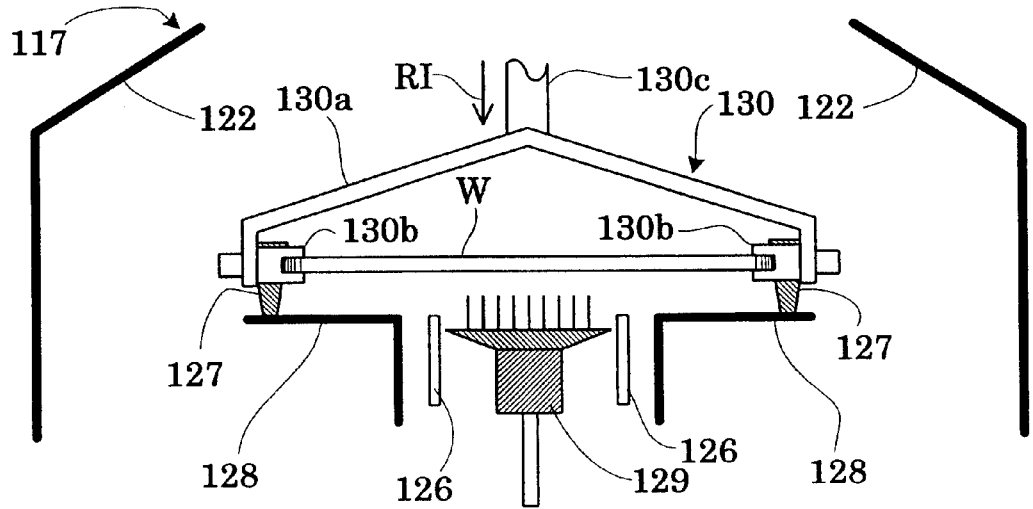
FIG. 18 is a side view illustrating the way in which the substrate is turned over for the back rinsing process immediately following the coating process.

After the reversal, as shown in FIG. 18, the arm support shaft 130c of the reversing mechanism 130 is lowered in the direction of arrow RI, to lower the arm 130a, holding shafts 130b and wafer W. The mechanical chucks 127 support the edges of wafer W to hold the wafer W again. After the mechanical chucks 127 hold the wafer W, the holding shafts 130b are moved right and left to release the wafer W. After the release, the back rinsing process is started.

With the wafer W turned over by the rotation of arm support shaft 130c and holding shafts 130b, the mechanical chucks 127 support areas of wafer W for the back rinsing process different from the areas supported in time of the coating process As a result, as in the tenth embodiment, the back rinse nozzles 126 and brush 129 of the dedicated rinsing unit 117 can remove stains from the entire area on the back surface of wafer W supported by the mechanical chucks 127 in time of the coating process.

To reduce contamination of the coating transport mechanism 115 and the adverse effect on the dedicated rinsing unit 117, the dedicated rinsing unit 117 may include edge rinse nozzles 121 for removing stains from the edges of wafer W. Further, the dedicated rinsing unit 117 may include cup rinse nozzles 123 for cleaning the scatter preventive cup 122.

In the eleventh embodiment, the dedicated rinsing unit 117 in the tenth embodiment is used also as the dedicated coating unit 116. As in the ninth embodiment, the dedicated coating unit 116 and dedicated rinsing unit 117 may be provided separately, and the coating transport mechanism 115 in the ninth embodiment may be given the function for reversing the wafer W. The dedicated coating unit 116 in the ninth embodiment may be used also as the dedicated rinsing unit 117, with the reversing mechanism 130 disposed above the dedicated coating unit 116 for turning over the wafer W for the back rinsing process performed immediately after the coating process. That is, the processes in the processing section of the ninth and tenth embodiments of the present invention may be carried out in the same unit (chamber), or may be carried out separately in the respective units in the first and second sections.

The present invention is not limited to the foregoing embodiments, but may be modified as follows:

(5) In the ninth to eleventh embodiments described above, the photoresist solution is used as an example of coating solutions. As noted in the modification (1), the invention is applicable also where polyimide resin or SOG (spin on glass) is used for coating. The invention may be applied also where a developer is used for coating. The developing section 112 in the ninth embodiment may be divided into a developer coating function and a rinsing function. The developer coating function may be performed by the dedicated coating unit 116 in the ninth embodiment, and the rinsing function by the dedicated rinsing unit 117 in the ninth embodiment.

(6) In the ninth to eleventh embodiments, the substrate processing apparatus is connected with the exposing apparatus STP corresponding to the external processing apparatus of the present invention through the interface 104. The external processing apparatus connected to the substrate processing apparatus is not limited to the exposing apparatus. The invention is applicable to the substrate processing apparatus only, without an external processing apparatus connected thereto.

(7) In the ninth to eleventh embodiments, the coating process is carried out to form a film on the wafer W while spinning the wafer W. As noted in the modification (2), a slit nozzle may be driven to sweep over a wafer maintained still to cover the wafer surface with a coating solution. As an alternative coating process, a coating solution may be first applied to an applicator sheet, and the sheet may then be applied to a wafer to supply the coating solution to the wafer, the sheet being separated from the wafer after heat treatment, thereby transferring a coating film from the sheet to the wafer.

(8) In the ninth to eleventh embodiments, the dedicated coating unit 116 includes the edge rinse nozzles 121 for removing the photoresist solution P from the edges of wafer W, marks made on the wafer W when the latter is held, and particles of the coating solution from the wafer W. The edge rinse nozzles 121 may be arranged also in the dedicated rinsing unit 117. The edge rinse nozzles 121 may be arranged in either the dedicated coating unit 116 or the dedicated rinsing unit 117. Considering the adverse effect on the coating transport mechanism 115 which transports wafers W between the dedicated coating unit 116 and dedicated rinsing unit 117, the edge rinse nozzles 121 should preferably be provided in at least the dedicated coating unit 116 which performs the process first. Though not absolutely necessary, it is desirable to provide the edge rinse nozzles 121 in order to avoid the adverse effect due to stains on the coating transport mechanism 115 and dedicated rinsing unit 117.

(9) In the ninth to eleventh embodiments, the first and second holding devices of the present invention for holding the wafer W in horizontal posture are the spin chuck that supports the central portion on the back surface of wafer W and the mechanical chucks that support the edges of wafer W. However, the spin chuck and mechanical chucks are not limitative. For example, the first and second holding devices may be constructed to support the wafer W in a plurality of positions (e.g. three positions) other than the central portion or edges. One of the first and second substrate holding devices may support the wafer W in a plurality of positions other than the central portion or edges, the other device being the above spin chuck or mechanical chucks. Where the coating solution is made into a film by spinning the wafer W, it is a usual practice to spin the wafer W at high speed. Thus, the first substrate holding device (e.g. the spin chuck 119 in the ninth embodiment), preferably, is constructed to withstand the high-speed spin of the wafer W.

(10) In the ninth to eleventh embodiments, the spin chuck 119 acts as the vacuum chuck of the present invention for supporting the central portion of wafer W by suction, and spinning the wafer W in a horizontal plane. The device for suction-supporting the central portion of wafer W is not limited to the spin chuck, but may be a vacuum chuck for suction-supporting the central portion of wafer W and holding the wafer W still, instead of spinning the wafer W in a horizontal plane. Such a vacuum chuck that does not spin the wafer W in a horizontal plane is particularly useful for a scan type coating process where a slit nozzle is driven to sweep over a stationary wafer W as noted in the modification (7).

(11) In the ninth embodiment, the spin chuck 125 of the dedicated rinsing unit 117 has a smaller diameter than the spin chuck 119 of the dedicated coating unit 116. As a result, the area of wafer W supported in time of the back rinsing process is smaller than the area supported in time of the coating process. For example, mechanical chucks may be provided in both the dedicated coating unit 116 and dedicated rinsing unit 117, the mechanical chucks of the dedicated rinsing unit 117 supporting a smaller area of wafer W than the mechanical chucks of the dedicated coating unit 116. Thus, the area of wafer W supported in time of the back rinsing process is smaller than the area supported in time of the coating process.

(12) In the ninth embodiment, the area $S_2$ ($=\pi \times r_2^2$) (the second support area of the present invention) of wafer W suction-supported by the spin chuck 125 of the dedicated rinsing unit 117 is smaller than an area $S_1$ ($=\pi \times r_1^2$) (the first support area of the invention) suction-supported by the spin chuck 119 of the dedicated coating unit 116. Thus, the spin chuck 125 acting as the second substrate holding device of the invention supports the second support area $S_2$ different from the first support area $S_1$ supported by the spin chuck 119 acting as the first substrate holding device of the invention. Where the first and second support areas include a central portion on the back surface of wafer W, the first and second support areas may be staggered relative to each other while including the central portion on the back surface of wafer W. In this way, the second substrate holding device may support the second support area different from the first support area supported by the first substrate holding device.

(13) In the ninth to eleventh embodiments, the first substrate holding device of the invention supports the back surface of wafer W for allowing stains to be removed efficiently from the back surface of wafer W. The substrate holding device may be constructed to support peripheral surfaces of wafer W for allowing stains to be removed efficiently from the peripheral surfaces. For this purpose, the dedicated coating unit 116 in the ninth embodiment, for example, may include a mechanical chuck (not shown), in place of the spin chuck 119, for gripping peripheral surfaces of wafer W, the back rinse nozzles 126 of the dedicated rinsing unit 117 supplying the rinse solution R to the back surface and peripheral surfaces of wafer W. In this case, stains adhering to the peripheral surfaces of wafer W may be removed efficiently. The dedicated coating unit 116 corresponds to the third processing section of the present invention. The mechanical chucks for holding the peripheral surfaces of wafer W correspond to the third substrate holding device of the invention.

Twelfth Embodiment

With wafers increasing in diameter today, an extended processing time is required to dry the resist applied thereto. However, it is impracticable to transport such a wafer while drying the resist applied thereto, since this is likely to cause a defective transport. A drying process should be carried out in a coating unit that applies the resist.

That is, in a resist coating step, it is difficult to adjust a processing time and distribute the processing time to a coating process and a rinsing process appropriately as described in Japanese Patent No. 3164739 noted hereinbefore. The present invention is applicable to such processing to produce the advantages described hereinafter.

In this embodiment, therefore, the present invention is applied to a series of processes relating to resist coating among other processes carried out by a substrate processing apparatus. This embodiment will particularly be described hereinafter with reference to the drawings.

Generally, a plurality of processing units in the present invention share processes involving an increase or decrease of "processing objects", and a chain of such processes constitutes one stage. The "processing objects" here include:

a "chemical" in a "chemical process";

"heat" in "heat treatment" (heating and cooling);

"foreign matters" in a "cleaning process";

"moisture" on wafers in a "drying process"; and a "layer to be exposed" in an "exposing process".

In the embodiment of the present invention, the "one stage" is a stage for ultimately attaining a "state having a resist layer formed on a main, front surface of a wafer except edges thereof" in which the "processing object" is a resist solution which is one example of chemicals. In this case, the following three processes constitute the "one stage":

"resist application to the wafer (i.e. an increase of resist on the wafer)",

"edge rinsing (i.e. a partial decrease of the resist layer on the wafer)", and

"back rinsing (i.e. a partial decrease of the resist layer on the wafer)".

Although a rinse solution is used in the edge rinsing and back rinsing, the "processing object" is "(part of) the resist". These processes involve an increase or decrease of the resist on the wafer.

On the other hand, although the "chemical process" and "heat treatment", for example, may be performed consecutively, the processing objects that increase or decrease are not the same; what increases or decreases is a "chemical (layer) on the wafer" in the former and "hotness or coldness (temperature) of the wafer" in the latter. Thus, these processes constitute a plurality of stages rather than "one stage". In this sense, the parallel processing particularly described hereinafter and corresponding to the features of the present invention is different, for example, from a technique for providing a plurality of hot plates (for heat treatment) arranged in parallel to secure a consistency in processing time between chemical process and heat-treating process.

Figure 19:
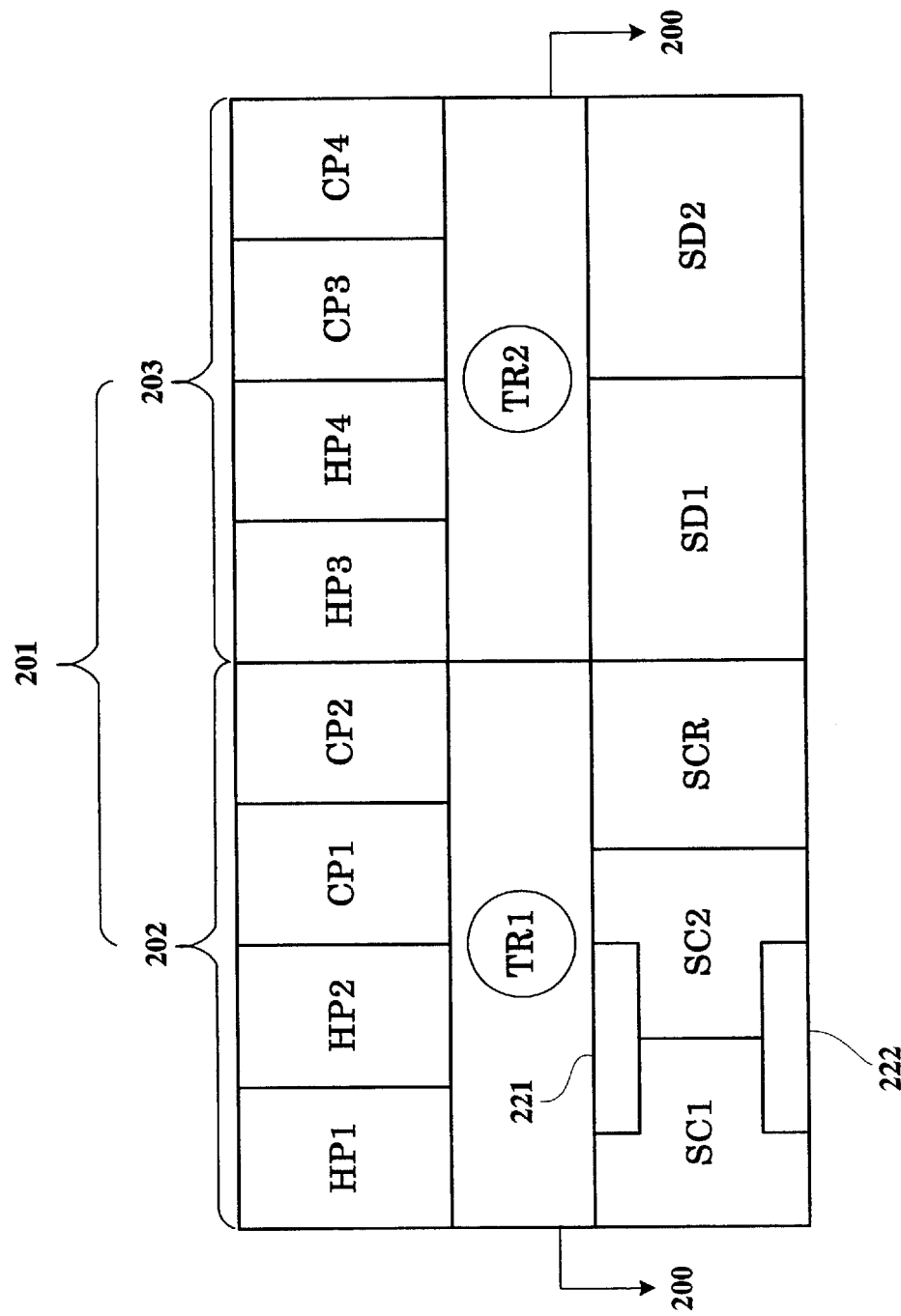
FIG. 19 is a plan view of a substrate processing apparatus in a twelfth embodiment.

FIG. 19 is a plan view of a substrate processing apparatus 201 according to the present invention. The substrate processing apparatus 201 includes a coating section 202 for performing a series of processes relating to resist application to wafers, and a developing section 203 for performing a series of processes relating to development of resist films with circuit patterns and the like exposed.

The coating section 202 includes heating units HP1 and HP2, cooling units CP1 and CP2, coating units SC1 and SC2 (which may be called collectively hereinafter "coating unit"), and a rinsing unit SCR.

The heating units HP1 and HP2 have hot plates for heating or maintaining the wafers to/at a fixed temperature. The cooling units CP1 and CP2 have cold plates for cooling the wafers to a fixed temperature. The developing section 203 includes heating units HP3 and HP4 and cooling units CP3 and CP4 having constructions and functions similar to those noted above.

Each of the coating units SC1 and SC2 has a spin coater for forming a uniform resist film on a wafer by dripping a resist on the wafer in horizontal posture and spinning the wafer. The coating units SC1 and SC2 share a resist nozzle 222.

The rinsing unit SCR is a processing unit dedicated to a rinsing process (edge rinsing and back rinsing) of wafers. The edge rinsing is a process for removing unwanted part of the resist, with a solvent, from edges including peripheral regions on the front surface and peripheral surfaces of a wafer. This process is carried out to avoid the resist on the edges of the wafer being transferred, through contact, and adhering to a transport robot TR1 that transports the wafer coated with the resist, and to positioning members used in other stages. It is to be noted that, usually, there is no need to apply the resist to the peripheral regions on the front surface of a wafer to form circuit patterns on such regions. The back rinsing is carried out to remove, with the solvent, part of the resist having drifted and adhering to the back surface of the wafer in time of resist application.

The plurality of processing units in the coating section 202 having the foregoing functions, respectively, share one stage of processing as a plurality of processes involving an increase and decrease of the processing object. The rinsing unit SCR has a shorter processing time than the coating units. The plurality of coating units SC1 and SC2 correspond to the first partial processing units of the present invention. The rinsing unit SCR corresponds to the second partial processing unit of the invention.

The coating section 202 has the transport robot TR1 for transporting wafers to each processing unit. The transport robot TR1 is movable right and left in FIG. 19, and has a transport arm (not shown) for holding each wafer. The transport arm is rotatable and vertically movable relative to the transport robot TR1. The transport robot TR1 transports the wafer to each processing unit by moving the transport arm to a predetermined position. The transport robot TR1 and the like correspond to the transport mechanism of the present invention. The developing section 203 has a transport robot TR2 of similar construction. The wafer is transported between the coating section 202 and developing section 203 through an interface not shown.

Further, as described in detail hereinafter, an air-conditioner 221 has a function to control the temperature and humidity in the coating units within predetermined ranges to enable the resist coating process to be performed in optimal conditions.

The developing section 203 includes the heating units HP3 and HP4, the cooling units CP3 and CP4, developing units SD1 and SD2, and the transport robot TR2. Each of the developing units SD1 and SD2 has what is known as a spin developer for spinning each wafer to develop, clean and dry the wafer.

Figure 20:
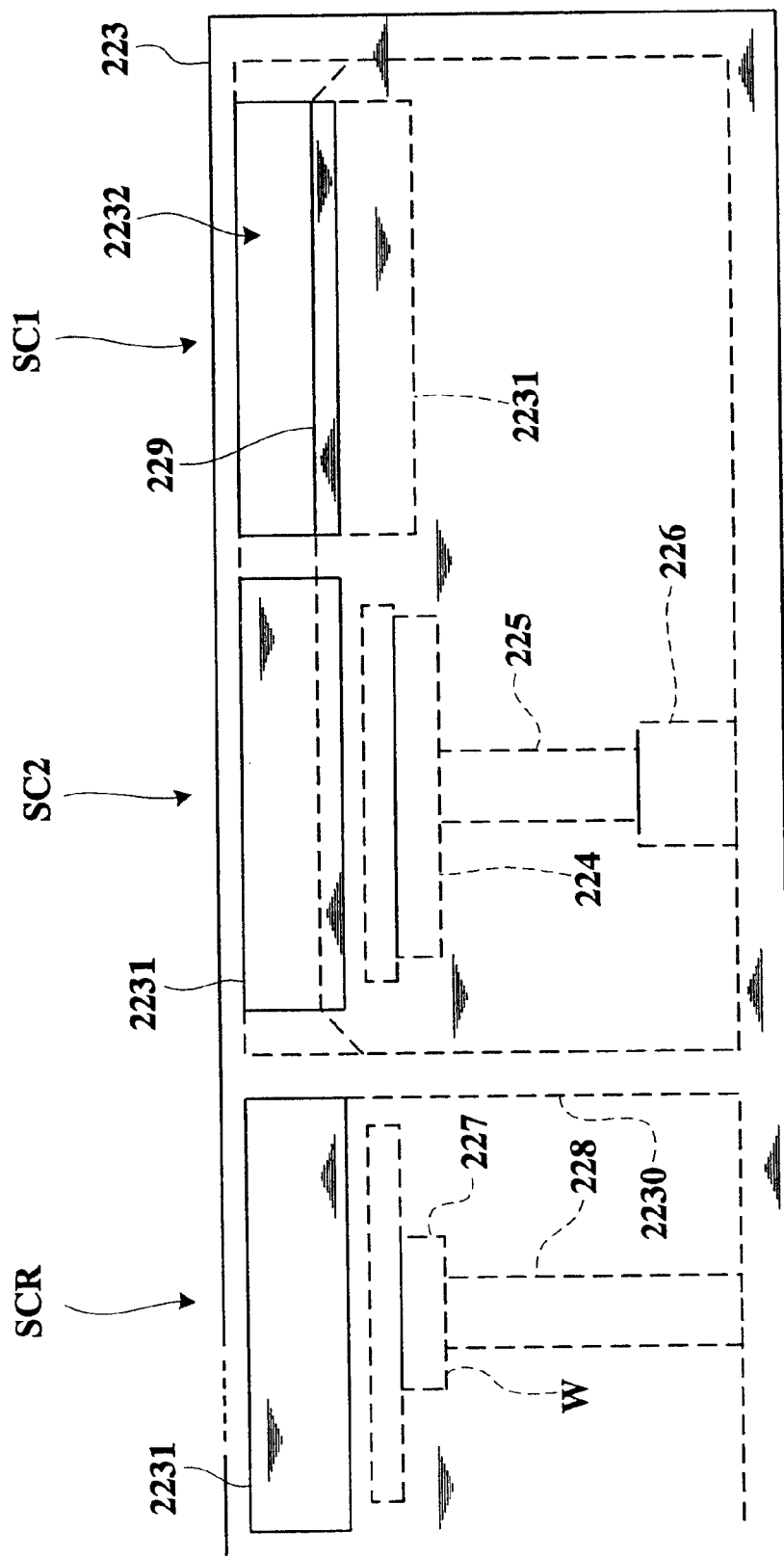
FIG. 20 is a side view of the substrate processing apparatus seen from line 200—200 of FIG. 19.

FIG. 20 is a side view of the substrate processing apparatus 201 seen from line 200—200 of FIG. 19. However, FIG. 20 shows only a portion relating to the coating section 202.

Each coating unit has a spin chuck 224, a rotary shaft 225 and a lift mechanism 226 disposed in a spin cup 229. The rinsing unit SCR has a spin chuck 227 and a rotary shaft 228.

The coating units and rinsing unit SCR are arranged in a cover 223. The coating unit SC2 and rinsing unit SCR are completely separated by a partition 2230 disposed in the cover 223.

The cover 223 has three vertically slidable shutters 2231 opposed to the transport robot TR1, and openings 2232 exposed when the shutters 2231 slide downward.

When transporting the wafer W to each processing unit, the transport robot TR1 inserts the transport arm into the cover 223 through the associated opening 2232. The technique for forming the openings in the cover 223 for transporting the wafer W is not limitative, but other well-known techniques may be used. The coating units SC1 and SC2 have no partition therebetween, whereby the processes for coating the wafers W with the resist are carried out in the same atmosphere.

Figure 21:
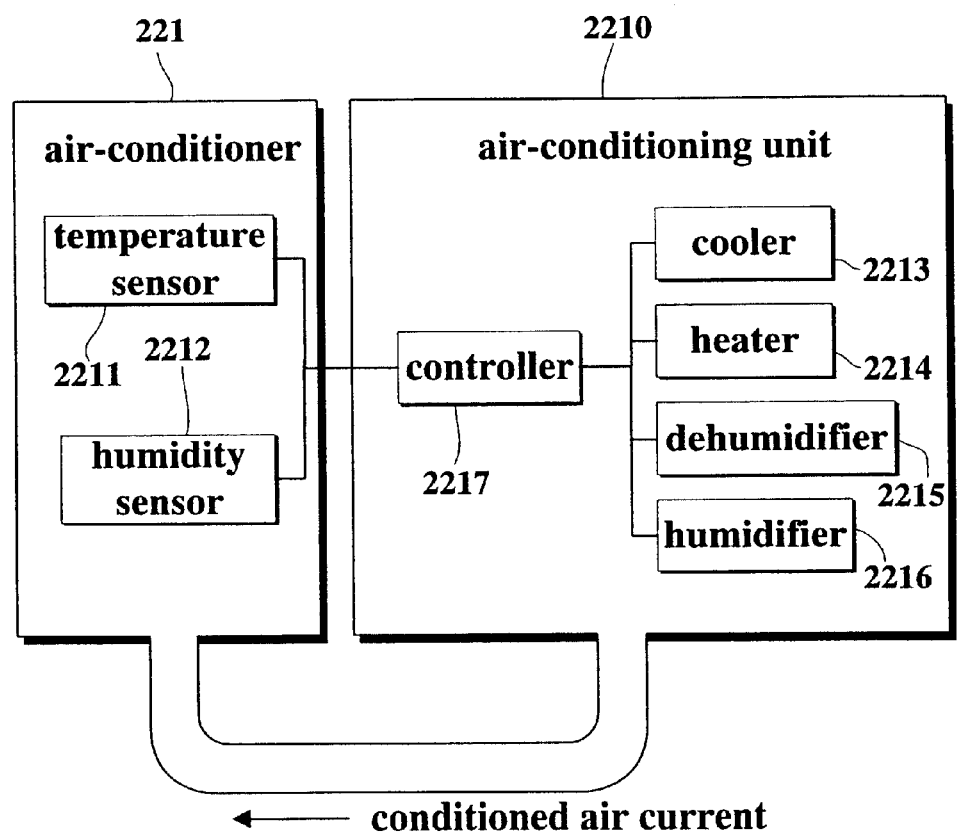
FIG. 21 is a view illustrating functions of an air-conditioner and an air-conditioning unit.

FIG. 21 is a view illustrating the functions of the air-conditioner 221 and an air-conditioning unit 2210. The air-conditioner 221 includes a temperature sensor 2211 for measuring temperature, and a humidity sensor 2212 for measuring humidity. The air-conditioning unit 2210, though not shown in FIG. 19, is disposed outside the processing units, and includes a cooler 2213 and a heater 2214 for adjusting temperature, a dehumidifier 2215 and a humidifier 2216 for adjusting humidity, and a controller 2217.

Based on results of detection received from the temperature sensor 2211 and humidity sensor 2212, the controller 2217 appropriately controls the cooler 2213, heater 2214, dehumidifier 2215 and humidifier 2216. The air-conditioning unit 2210 thereby generates air having a temperature and humidity appropriately adjusted, and discharges the air to the air-conditioner 221 as conditioned air current. The conditioned air is discharged from the air-conditioner section 221 into the cover 223. That is, the air-conditioner 221 and air-conditioning unit 2210 have a function to maintain the temperature and humidity in the cover 223 within predetermined ranges suited for resist coating.

As a result, in the substrate processing apparatus 201, the temperature and humidity only in the space (inside the cover 223) accommodating the coating units are controlled to be within the predetermined ranges necessary for resist coating. The substrate processing apparatus 201 has a simplified construction compared with the case of controlling the temperature and humidity of all the spaces in the apparatus.

Figure 22:
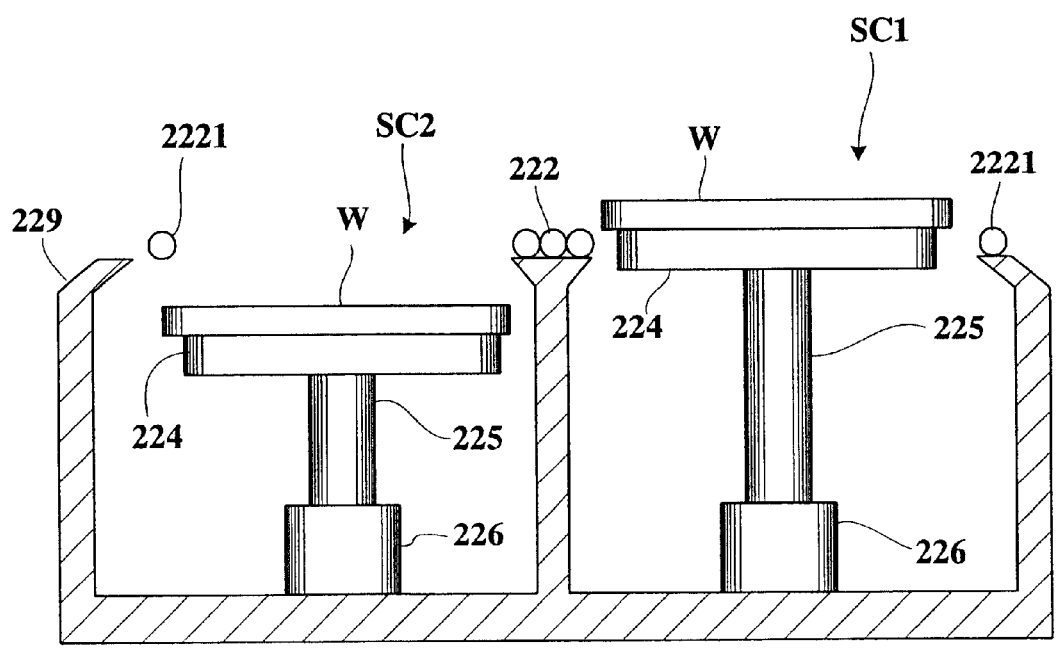
FIG. 22 is a view illustrating the construction of coating units.

FIG. 22 is a view showing the coating units SC1 and SC2. The spin cup 229 is open at the top. The coating units SC1 and SC2 perform the resist coating processes in the same atmosphere as noted hereinbefore. However, the coating units SC1 and SC2 are partitioned from each other in the spin cup 229, so that a chemical or the like used in one unit does not affect a wafer W being processed in the other. The spin cup 229 need not be the type that accommodates the two coating units. That is, the coating units SC1 and SC2 may be mounted in separate spin cups.

As shown in FIG. 22, each of the coating units SC1 and SC2 includes a spin coater having a spin chuck 224 and a rotary shaft 225, a lift mechanism 226 for raising and lowering the spin coater, and a rinse nozzle 2221. The coating units SC1 and SC2 share the resist nozzle 222 which delivers the resist.

The spin chuck 224 is fixed to the upper end of the rotary shaft 225. The spin chuck 224 can hold a wafer W at the back surface of wafer W. The rotary shaft 225 is driven by torque transmitted from a spin motor not shown, whereby the spin chuck 224 spins about the axis (extending vertically) of the rotary shaft 225 to spin the wafer W maintained in a substantially horizontal posture on the spin chuck 224. The spin chuck 224 may hold the wafer W by vacuum suction, for example.

When the transport robot TR1 loads or unloads the wafer W into/from each coating unit, the lift mechanism 226 moves the spin coater to an upper position (where the spin chuck 224 is exposed from the upper opening of the spin cup 229; see the spin coater of coating unit SC1 shown in FIG. 22). Then, the wafer W is placed on or removed from the spin chuck 224 by the transport arm of transport robot TR1.

The resist nozzle 222 has a plurality of discharge openings for delivering the resist, and has a function to coat the resist over the surface of wafer W by uniformly delivering the resist supplied from a resist tank, not shown, to the surface of wafer W. The resist nozzle 222 is movable right and left in FIG. 22, to deliver the resist to the wafer W processed in any one of the coating units SC1 and SC2.

Each rinse nozzle 2221 is in the form of a discharge opening formed at a forward end of a hollow tubular member for delivering a rinsing solvent. The rinse nozzle 2221 has an edge rinsing function to remove unwanted resist from the edges of wafer W by delivering the rinsing solvent supplied from a solvent tank not shown to the peripheral regions on the front surface of wafer W. The rinse nozzle 2221 is movable right and left in FIG. 22, and is retractable to be clear of the wafer W when the lift mechanism 226 moves the spin coater to the upper position. The position of the rinse nozzle 2221 in the coating unit SC1 shown in FIG. 22 will be called hereinafter a "standby position", and the position of the rinse nozzle 2221 in the coating unit SC2 a "processing position". Each rinse nozzle 2221 delivers the rinsing solvent to an area on the wafer W to be contacted by the transport arm of transport robot TR1 holding the wafer W.

Figure 23:
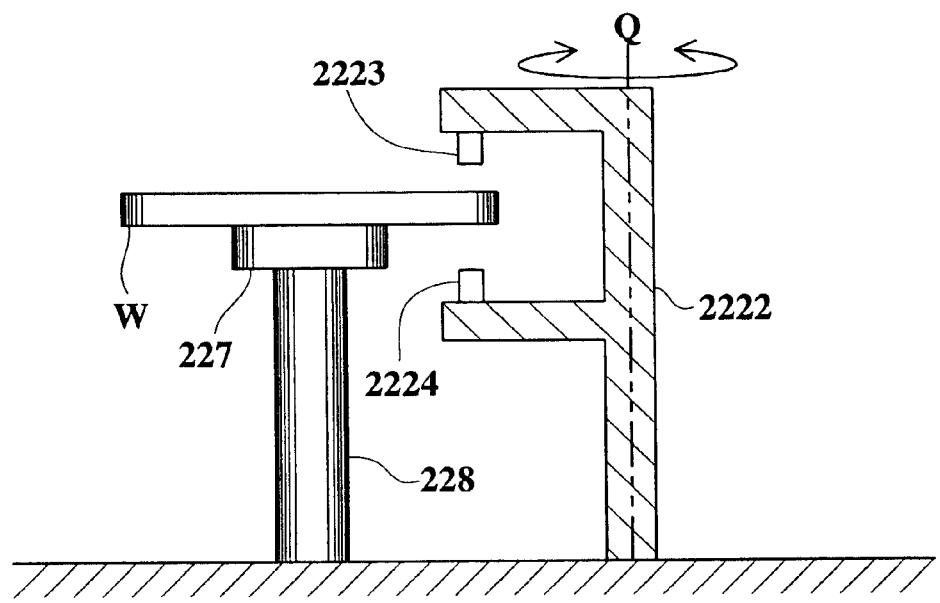
FIG. 23 is a view illustrating the construction of a rinsing unit.

FIG. 23 is a view showing the rinsing unit SCR. The rinsing unit SCR has a spin chuck 227 and a rotary shaft 228 having constructions similar to the spin chuck 224 and rotary shaft 225 of each coating unit. The rinsing unit SCR has a support member 2222, an edge rinse nozzle 2223 and a back rinse nozzle 2224.

The support member 2222 supports the edge rinse nozzle 2223 and back rinse nozzle 2224 in predetermined positions, and is rotatable about a center axis Q. The support member 2222 retracts the edge rinse nozzle 2223 and back rinse nozzle 2224 out of contact with the wafer W transported to and from the spin chuck 227.

The edge rinse nozzle 2223 and back rinse nozzle 2224 deliver the rinsing solvent supplied from the solvent tank to predetermined positions of wafer W to remove unwanted parts of the resist applied to the wafer W in one of the coating units. The edge rinse nozzle 2223 removes the resist from the peripheral regions on the front surface of wafer W. The back rinse nozzle 2224 removes the resist from the back surface of wafer W.

The coating units, which perform the resist coating process and spin drying process, are required to accelerate and decelerate the spin of wafer W sharply. Thus, the spin chuck 224 of each coating unit is required to possess a relatively strong suction. A large-diameter spin chuck is used that has a large suction area. However, the rinsing unit SCR is a processing unit dedicated to the rinsing process as noted hereinbefore. The spin of wafer W does not require sharp acceleration or deceleration. Thus, a sufficient suction may be provided by a small-diameter spin chuck (with a small suction area and weak suction).

For this reason, the spin chuck 227 of the rinsing unit SCR may have a smaller diameter than the spin chuck 224 of each coating unit (see FIG. 20). Particles having adhered to the back surface of wafer W in each coating unit may be washed away the more efficiently for the smaller diameter (i.e. the smaller area) in time of back rinsing. This reduces the particles remaining on the back surface of wafer W.

The substrate processing apparatus 201 has the construction described above. A wafer processing operation of the substrate processing apparatus 201 will be described next.

First, the air-conditioner 221 is operated to adjust the temperature and humidity of the space in the cover 223 accommodating the coating units to values suited for the resist coating process. The temperature and humidity are thereafter maintained within the predetermined ranges.

Next, of the shutters 2231 of the cover 223, the shutter 2231 associated with the coating unit SC1 is slid downward to expose the opening 2232. The lift mechanism 226 of the coating unit SC1 moves the spin coater to the upper position.

The transport robot TR1 loads a wafer W on the spin chuck 224 of the coating unit SC1. The wafer W is suction-supported by the spin chuck 224.

Once the wafer W is introduced, the lift mechanism 226 of the coating unit SC1 moves the spin coater to a lower position (corresponding to the position of the spin coater of coating unit SC2 in FIG. 22). The shutter 2231 is slid upward to isolate the coating unit SC1 spatially from the other processing units. The rinsing unit SCR also, during the rinsing process, has the associated shutter 2231 slid upward to be spatially isolated from the other processing units by the cover 223.

Thus, the plurality of processing units are spatially isolated on the basis of units performing the same process, at least during the process. The solvent used in the rinsing process, for example, never scatters into the coating units. The wafer W processed by each processing unit is prevented from being affected by other processes.

Once the spin coater has been moved to the lower position, the resist nozzle 222 moves to a position above the coating unit SC1. When the spin motor starts spinning the wafer W, the resist is delivered from the resist nozzle 222 to uniformly coat the wafer W.

When the resist coats the wafer W sufficiently, the resist nozzle 222 stops delivering the resist, and a spin drying process is started. During the drying process, the resist nozzle 222 is moved to a position between the coating units SC1 and SC2, and the rinse nozzle 2221 of the coating unit SC1 is moved to the processing position.

After the drying process, the coating unit SC1 delivers the rinsing solvent from the rinse nozzle 2221 to remove the resist from the edges of wafer W. That is, the rinsing process performed with the rinse nozzle 2221 corresponds to the first edge rinsing process of the present invention. This process can remove the resist beforehand from the portions to be contacted by the transport arm of transport robot TR1, thereby to avoid a defective transport occurring when the wafer is transported from the coating unit to the rinsing unit SCR.

The rinse process in the coating unit (hereinafter called the "simple rinsing process) serves the purpose as long as it is applied only to the areas contactable by the transport arm of transport robot TR1, of the peripheral regions on the surface of wafer W. This is because unwanted parts of the resist adhering to the entire peripheral regions on the surface of wafer W are removed thoroughly by the edge rinsing carried out immediately afterward in the rinsing unit SCR.

As a result, the simple rinsing process may cover a smaller range of wafer W than the edge rinsing process by the rinsing unit SCR. The edge rinsing function of each coating unit is simplified to simplify the construction of the coating unit.

After the simple rinsing process, the coating unit SC1 moves the rinse nozzle 221 to the standby position, and causes the lift mechanism 226 to move the spin coater to the upper position. Subsequently, the transport robot TR1 transports the coated wafer W to the rinsing unit SCR with the transport arm.

The transport robot TR1 starts transporting a wafer W to the coating unit SC2 after lapse of a predetermined time from a start of transport of wafer W to the coating unit SC1. That is, the coating units SC1 and SC2 perform the same processes with a predetermined time lag. The wafer W is transported to the rinsing unit SCR every predetermined time.

The resist coating in the coating unit SC1 has completed by the time the resist coating is started in the coating unit SC2. Thus, the resist nozzle 222 is free from conflict between the coating units SC1 and SC2. That is, the coating units SC1 and SC2 can share the resist nozzle 222, and there is no need to provide a resist nozzle for each coating unit. This feature allows the substrate processing apparatus 201 to be reduced in cost. Individual differences among the wafers occurring where a plurality of coating units are used in parallel processing are caused chiefly by using separate delivery lines. In the substrate processing apparatus 201, one delivery system (resist nozzle) is shared by the two coating units, thereby reducing the individual differences among the wafers manufactured.

Figure 24:
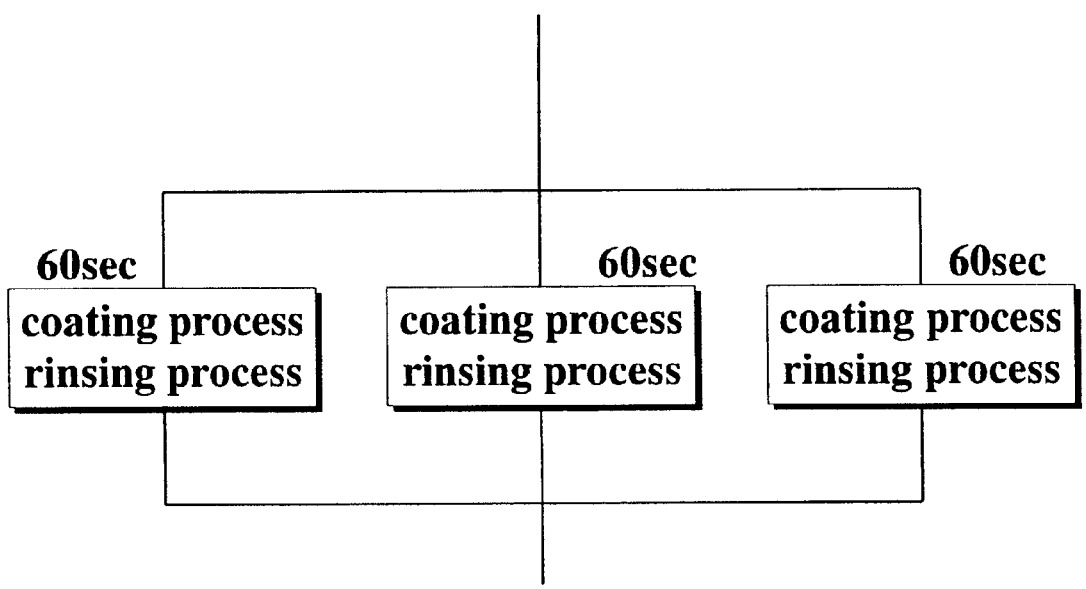
FIG. 24 is a conceptual diagram of processes by a conventional substrate processing apparatus.
Figure 25:
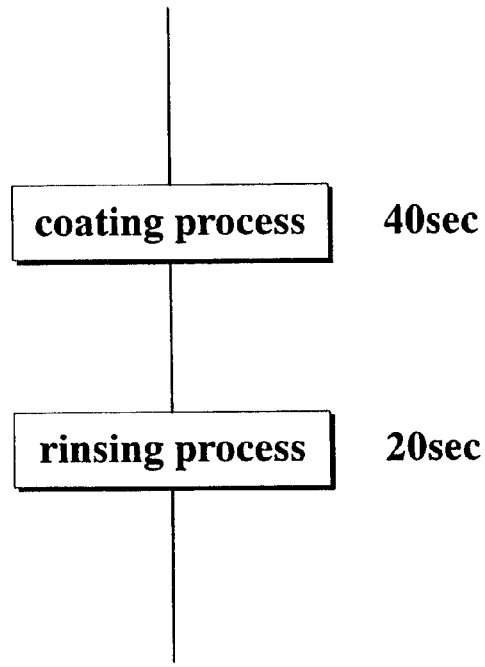
FIG. 25 is a conceptual diagram of processes by another conventional substrate processing apparatus.
Figure 26:
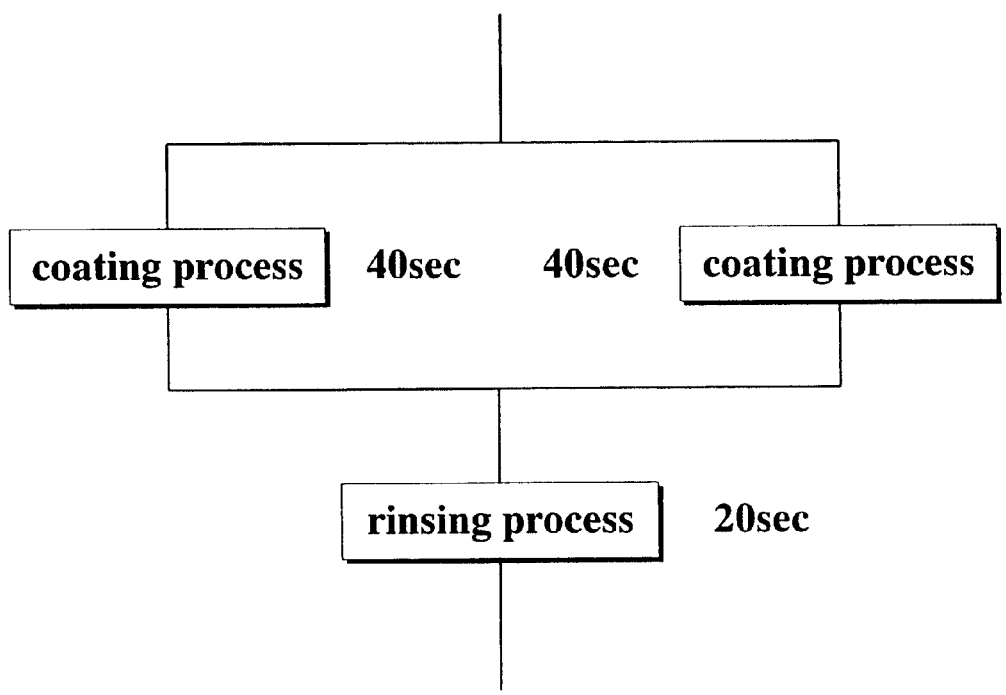
FIG. 26 is a conceptual diagram of processes by the substrate processing apparatus in the twelfth embodiment.

FIGS. 24 through 26 are conceptual diagrams for comparing processes in conventional methods and the processes by the substrate processing apparatus 201. It is assumed here that the processing time of the coating process is 40 seconds, and the processing time of the rinsing process 20 seconds.

In the conventional parallel processing method shown in FIG. 24, three processing units are used for parallel processing, each unit performing a 40-second coating process and a 20-second rinsing process. This realizes a throughput of 20 seconds per wafer.

In the conventional serial processing method shown in FIG. 25, a coating process is assigned to a coating unit, and a rinsing process to a rinsing unit. However, an equal processing time cannot be allowed for the coating process and rinsing process. The rinsing unit has to wait for completion of the process in the coating unit. This results in a low throughput of 40 seconds per wafer.

The substrate processing apparatus 201 in this embodiment shown in FIG. 26 adopts a parallel processing for only the coating process, in the series of processes, that consumes the longer time. This realizes a throughput of 20 seconds per wafer. That is, the substrate processing apparatus 201 can avoid the throughput being limited by a process requiring the longer processing time where a difference in processing time occurs between the processing units. The throughput may be maintained even where, with the increase in wafer size, the resist coating process tends to require an extended processing time.

In the present invention, generally, where the processing units requiring a long processing time are "the first partial processing units", the parallel processing is allocated to the first partial processing units, N in number (N being an integer 2 or more). Where, for example, the processing time of one first partial processing unit is T1, a time interval between wafers being loaded into the first units arranged in parallel (=a time interval between wafers being unloaded therefrom) is T1/N. In FIG. 26, the time T1/N is substantially the same as the processing time T2 (<T1) of the other processing unit (e.g. the second partial processing unit), i.e. T1/N=T2. In this case, the throughput is maximized. On the other hand, where the processing time T1 in the first partial processing units is much longer than the processing time T2 in the second partial processing unit, the parallel arrangement of the first partial processing units may still allow an inequality T1/N>T2. In this case, the problem of the first processing units constituting a limitation is not entirely solved. However, compared with the case of N=1, an overall throughput reduction may be checked or moderated.

Reverting to the operation, the wafer W transported to the rinsing unit SCR is spun as in the coating unit. The support member 2222 is rotated to move the edge rinse nozzle 2223 and back rinse nozzle 2224 to the predetermined positions. Subsequently, the rinsing solvent is delivered from each nozzle to remove unwanted parts of the resist from the peripheral regions on the front surface and from the back surface of wafer W.

With the rinsing unit SCR performing the rinsing process including the back rinsing as described above, the resist coating step may be divided into the coating process and rinsing process. This simplifies the construction of each coating unit.

After the rinsing process, the support member 2222 is rotated to retract the edge rinse nozzle 2223 and back rinse nozzle 2224. The transport robot TR1 carries the wafer W out with the transport arm. The wafer W carried out of the rinsing unit SCR is heated by the heating unit HP1 or HP2, then cooled by the cooling unit CP1 or CP2, and transported to an exposing apparatus not shown.

The wafer W with circuit patterns and the like exposed in the exposing apparatus is developed by the developing unit SD1 or SD2 in the developing section 203. Then, the wafer W is treated by the heating unit HP3 or HP4 and cooling unit CP3 or CP4 as necessary.

Thus, the substrate processing apparatus 201 assigns the parallel processing to the processing units requiring a long processing time, thereby avoiding this processing time imposing a limitation to prevent a reduction in throughput. Particularly, a reduction is prevented from occurring in the throughput of the resist coating process requiring an extended time due to the increase in wafer size. Further, individual differences among the wafers W manufactured may be reduced by the plurality of coating units sharing the resist nozzle.

The present invention is not limited to the above embodiment, but may be modified as follows:

(14) For example, the resist nozzle 222 and rinse nozzle 2221 of each coating unit may be adapted movable vertically also. Then, the resist and rinsing solvent may be delivered within the spin cup 229.

(15) In the above embodiment, the coating units SC1 and SC2 share the resist nozzle 222. Besides, the coating units SC1 and SC2 may share one rinse nozzle 2221 also.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate processing apparatus comprising a coating section for forming a film of coating solution on a substrate, wherein said coating section performs a series of film forming processes including a coverage process for supplying a coating solution to the substrate and covering a surface of the substrate with the coating solution, a leveling process for making the coating solution on the substrate into a film, and a drying process for drying the film of coating solution formed on the substrate, said coating section including a plurality of separate processing units for successively performing said series of film forming processes as divided into separate time series.

2. A substrate processing apparatus as defined in claim 1, wherein said plurality of separate processing units include:
a coverage unit for performing said coverage process; and
a leveling and drying unit for performing said leveling process and said drying process on the substrate processed by said coverage unit.

3. A substrate processing apparatus as defined in claim 1, wherein said plurality of separate processing units include:
a coverage and leveling unit for performing said coverage process and said leveling process; and
a drying unit for performing said drying process on the substrate processed by said coverage and leveling unit.

4. A substrate processing apparatus as defined in claim 1, wherein said plurality of separate processing units include:
a coverage unit for performing said coverage process;
a leveling unit for performing said leveling process on the substrate processed by said coverage unit; and
a drying unit for performing said drying process on the substrate processed by said leveling unit.

5. A substrate processing apparatus as defined in claim 1, wherein said series of film forming processes includes a removing process for removing unwanted parts of the photoresist solution from the substrate, said coating section including a plurality of separate processing units for successively performing said series of film forming processes including said removing process as divided into separate time series.

6. A substrate processing apparatus as defined in claim 5, wherein said plurality of separate processing units include:
a coverage unit for performing said coverage process; and
a leveling, drying and removing unit for performing said leveling process, said drying process and said removing process.

7. A substrate processing apparatus as defined in claim 5, wherein said plurality of separate processing units include:
a coverage and leveling unit for performing said coverage process and said leveling process; and
a drying and removing unit for performing said drying process and said removing process.

8. A substrate processing apparatus as defined in claim 5, wherein said plurality of separate processing units include:
a coverage, leveling and drying unit for performing said coverage process, said leveling process and said drying process; and
a removing unit for performing said removing process.

9. A substrate processing apparatus as defined in claim 5, wherein said plurality of separate processing units include:
a coverage unit for performing said coverage process;
a leveling unit for performing said leveling process; and
a drying and removing unit for performing said drying process and said removing process.

10. A substrate processing apparatus as defined in claim 5, wherein said plurality of separate processing units include:
a coverage unit for performing said coverage process;
a leveling and drying unit for performing said leveling process and said drying process; and
a removing unit for performing said removing process.

11. A substrate processing apparatus as defined in claim 5, wherein said plurality of separate processing units include:
a coverage and leveling unit for performing said coverage process and said leveling process;
a drying unit for performing said drying process; and
a removing unit for performing said removing process.

12. A substrate processing apparatus as defined in claim 5, wherein said plurality of separate processing units include:
a coverage unit for performing said coverage process;
a leveling unit for performing said leveling process;
a drying unit for performing said drying process; and
a removing unit for performing said removing process.

13. A substrate processing apparatus as defined in claim 5, wherein said removing process comprises an edge rinsing for removing the film of coating solution from edges of the substrate.

14. A substrate processing apparatus as defined in claim 5, wherein said removing process comprises a back rinsing for removing the coating solution from a back surface of the substrate.

15. A substrate processing apparatus comprising a coating section for forming a film of coating solution on a substrate, a developing section for developing the substrate after a coating process and an exposing process, a heat-treating section for heat-treating the substrate before and after the coating and developing processes, and a transport mechanism for transporting the substrate to each processing section,
- wherein said coating section performs a series of film forming processes including a coverage process for supplying a coating solution on the substrate and covering a surface of the substrate with the coating solution, a leveling process for making the coating solution on the substrate into a film, and a drying process for drying the film of coating solution formed on the substrate,
- said coating section including a plurality of separate processing units for successively performing said series of film forming processes as divided into separate time series.

16. A substrate processing apparatus as defined in claim 15, wherein said coating section performs said series of film forming processes including, besides said coverage process, said leveling process and said drying process, a removing process for removing unwanted parts of the photoresist solution from the substrate.

17. A substrate processing apparatus as defined in claim 15, wherein said coating section further includes a dedicated transport mechanism for transporting the substrate between said plurality of separate processing units.

18. A substrate processing apparatus comprising a coating section including a first processing section for supplying a coating solution to a substrate, and a second processing section for supplying a cleaning solution to the substrate processed by said first processing section,
- wherein said first processing section includes:
  - first substrate holding means for holding the substrate in horizontal posture while supporting a first support area on a back surface of the substrate; and
  - coating solution supplying means for supplying the coating solution to a front surface of the substrate held by said first substrate holding means; and
- said second processing section includes:
  - second substrate holding means for holding the substrate in horizontal posture while supporting a second support area different from said first support area; and
  - cleaning solution supplying means for supplying the cleaning solution to clean a part or whole of said first support area on the back surface of the substrate held by said second substrate holding means.

19. A substrate processing apparatus as defined in claim 18, wherein said first substrate holding means is constructed to hold the substrate in horizontal posture by supporting a central portion of the back surface of the substrate, and said second substrate holding means is constructed to hold the substrate in horizontal posture by supporting edges of the substrate.

20. A substrate processing apparatus as defined in claim 18, wherein said first substrate holding means is constructed to hold the substrate in horizontal posture by supporting the first support area including a central portion of the back surface of the substrate, and said second substrate holding means is constructed to hold the substrate in horizontal posture by supporting the second support area including the central portion of the back surface of the substrate.

21. A substrate processing apparatus as defined in claim 18, wherein said first substrate holding means comprises a vacuum chuck for holding the substrate in horizontal posture by suction-supporting a central portion of the back surface of the substrate.

22. A substrate processing apparatus as defined in claim 20, wherein said first and second substrate holding means are constructed such that said second support area is smaller than said first support area.

23. A substrate processing apparatus as defined in claim 22, wherein each of said first and second substrate holding means comprises a vacuum chuck for holding the substrate in horizontal posture by suction-supporting a central portion of the back surface of the substrate, the vacuum chuck acting as said second substrate holding means having a smaller diameter than the vacuum chuck acting as said first substrate holding means.

24. A substrate processing apparatus as defined in claim 18, further comprising reversing means for turning over the substrate and placing the substrate back in position between processes by said first and second processing sections, whereby the substrate is turned over by said reversing means so that said second substrate holding means holds the substrate in horizontal posture while supporting said second support area different from said first support area.

25. A substrate processing apparatus as defined in claim 18, wherein at least one of said first processing section and said second processing section includes edge cleaning means for cleaning edges of the substrate.

26. A substrate processing apparatus as defined in claim 25:
- wherein said edge cleaning means is disposed in said first processing section;
- said apparatus further comprising first transport means for supporting the edges of the substrate and transporting the substrate between said first processing section and said second processing section;
- said first processing section performing a coating process on the front surface of the substrate, and an edge cleaning process for cleaning the edges of the substrate;
- said first transporting means transporting the substrate, after said coating process and said edge cleaning process, from said first processing section to said second processing section; and
- said second processing section performing a cleaning process for cleaning the part or whole of said first support area on the back surface of the substrate received from said first transport means.

27. A substrate processing apparatus comprising a coating section for forming a film of coating solution on a substrate:
- wherein said coating section includes a first processing section for supplying a coating solution to the substrate, and a second processing section for supplying a cleaning solution to the substrate processed by said first processing section;
- said apparatus further comprising second transport means for transporting the substrate between a plurality of processing sections including said first and second processing sections;
- said first processing section including:
  - first substrate holding means for holding the substrate in horizontal posture while supporting a first support area on a back surface of the substrate; and
  - coating solution supplying means for supplying the coating solution to a front surface of the substrate held by said first substrate holding means; and
- said second processing section including:
  - second substrate holding means for holding the substrate in horizontal posture while supporting a second support area different from said first support area; and cleaning solution supplying means for supplying the cleaning solution to clean a part or whole of said first support area on the back surface of the substrate held by said second substrate holding means.

28. A substrate processing apparatus comprising a coating section for forming a film of coating solution on a substrate:
wherein said coating section includes a first processing section for supplying a coating solution to the substrate, and a second processing section for supplying a cleaning solution to the substrate processed by said first processing section;
said apparatus further comprising second transport means for transporting the substrate between a plurality of processing sections including said first and second processing sections, an external processing apparatus connected to said substrate processing apparatus, and an interface for relaying transfer of the substrate between said processing sections and said external processing apparatus;
said first processing section including:
first substrate holding means for holding the substrate in horizontal posture while supporting a first support area on a back surface of the substrate; and
coating solution supplying means for supplying the coating solution to a front surface of the substrate held by said first substrate holding means; and
said second processing section including:
second substrate holding means for holding the substrate in horizontal posture while supporting a second support area different from said first support area; and
cleaning solution supplying means for supplying the cleaning solution to clean a part or whole of said first support area on the back surface of the substrate held by said second substrate holding means.

29. A substrate processing apparatus as defined in claim 28, wherein said external processing apparatus is an exposing apparatus for exposing the substrate after a coating process.

30. A substrate processing apparatus comprising:
a plurality of processing units for performing one stage of operation in which a processing object is in form of a particular substance on a substrate or in a particular form of energy relating to the substrate, said one stage being divided into a plurality of processes each involving an increase or decrease of said processing object; and
a transport mechanism for transporting said substrate to said plurality of processing units;
at least said processing units including:
a plurality of first partial processing units; and
a second partial processing unit for performing a partial process having a shorter processing time than a process performed by each of said first partial processing units;
said plurality of first partial processing units performing a parallel processing.

31. A substrate processing apparatus as defined in claim 30, wherein said processing object is a chemical applied to said substrate, said first partial processing units performing a chemical coating process on said substrate.

32. A substrate processing apparatus as defined in claim 31, wherein said chemical is a resist.

33. A substrate processing apparatus as defined in claim 31, wherein said second partial processing unit performs a rinsing process including a back rinsing process for removing said chemical from said substrate.

34. A substrate processing apparatus as defined in claim 33, wherein each of said first partial processing units and said second partial processing unit has a spin chuck for holding and spinning said substrate, the spin chuck of said second partial processing unit being smaller in diameter than the spin chuck of each of said first partial processing units.

35. A substrate processing apparatus as defined in claim 31, wherein each of said first partial processing units performs a first edge rinsing process for edges of said substrate coated with said chemical.

36. A substrate processing apparatus as defined in claim 35, wherein said rinsing process includes a second edge rinsing process, said first edge rinsing process covering a smaller range on said substrate than said second edge rinsing process.

37. A substrate processing apparatus as defined in claim 31, further comprising means for controlling at least one of temperature and humidity only in a space accommodating said first partial processing units, to be within a predetermined range.

38. A substrate processing apparatus as defined in claim 31, further comprising a chemical nozzle for delivering said chemical, said plurality of first partial processing units sharing said chemical nozzle.

39. A substrate processing apparatus as defined in claim 30, wherein said plurality of first partial processing units are spatially isolated on a basis of processing units performing the same process, at least during the process.

* * * * *